US011289599B2

(12) United States Patent
Syue et al.

(10) Patent No.: US 11,289,599 B2
(45) Date of Patent: Mar. 29, 2022

(54) POWER METAL-OXIDE-SEMICONDUCTOR FIELD EFFECT TRANSISTOR

(71) Applicant: Taiwan Semiconductor Manufacturing Co., Ltd., Hsin-Chu (TW)

(72) Inventors: Wan-Jyun Syue, Hsinchu County (TW); Chin-Yi Huang, Hsinchu (TW); Kuo-Lung Tzeng, Yilan County (TW); Zhuo-Cang Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/894,644

(22) Filed: Jun. 5, 2020

(65) Prior Publication Data
US 2020/0303542 A1     Sep. 24, 2020

Related U.S. Application Data

(62) Division of application No. 15/665,007, filed on Jul. 31, 2017, now Pat. No. 10,680,101.

(51) Int. Cl.
*H01L 29/78* (2006.01)
*H01L 21/762* (2006.01)
(Continued)

(52) U.S. Cl.
CPC .... *H01L 29/7825* (2013.01); *H01L 21/76229* (2013.01); *H01L 29/0649* (2013.01); *H01L 29/0653* (2013.01); *H01L 29/0692* (2013.01); *H01L 29/0865* (2013.01); *H01L 29/0878* (2013.01); *H01L 29/0882* (2013.01); *H01L 29/1037* (2013.01); *H01L 29/1095* (2013.01);
*H01L 29/41766* (2013.01); *H01L 29/41775* (2013.01); *H01L 29/4236* (2013.01); *H01L 29/4238* (2013.01); *H01L 29/42368* (2013.01); *H01L 29/42376* (2013.01);
(Continued)

(58) Field of Classification Search
CPC ......... H01L 21/76229; H01L 21/76224; H01L 29/0653; H01L 29/0649; H01L 29/7851; H01L 29/1095; H01L 29/7825; H01L 29/4236; H01L 29/66704; H01L 29/42376
See application file for complete search history.

(56) References Cited

U.S. PATENT DOCUMENTS 9,853,021 B1 * 12/2017 Wang ................ H01L 29/66545
2009/0256212 A1 * 10/2009 Denison ............. H01L 29/7825
257/408
2014/0042527 A1    2/2014 Lee

* cited by examiner

*Primary Examiner* — Marcos D. Pizarro
*Assistant Examiner* — Antonio B Crite
(74) *Attorney, Agent, or Firm* — Duane Morris LLP

(57) ABSTRACT

A semiconductor device includes: a first semiconductor region disposed over a second semiconductor region, wherein the first and second semiconductor regions have a first doping type and a second doping type, respectively; a first source/drain contact region and a second source/drain contact region having the second doping type and laterally spaced; and a gate electrode disposed laterally between the first and second source/drain contact regions, wherein the gate electrode comprises a first sidewall relatively closer to the first source/drain region and a second sidewall relatively closer to the second source/drain region, and wherein respective cross-sectional areas of the first and second sidewalls of the gate electrode are different from each other.

20 Claims, 42 Drawing Sheets

(51) Int. Cl.
*H01L 29/06* (2006.01)
*H01L 29/08* (2006.01)
*H01L 29/10* (2006.01)
*H01L 29/417* (2006.01)
*H01L 29/423* (2006.01)
*H01L 29/66* (2006.01)

(52) U.S. Cl.
CPC .. *H01L 29/66704* (2013.01); *H01L 29/66795* (2013.01); *H01L 29/785* (2013.01); *H01L 29/7851* (2013.01); *H01L 21/76224* (2013.01)

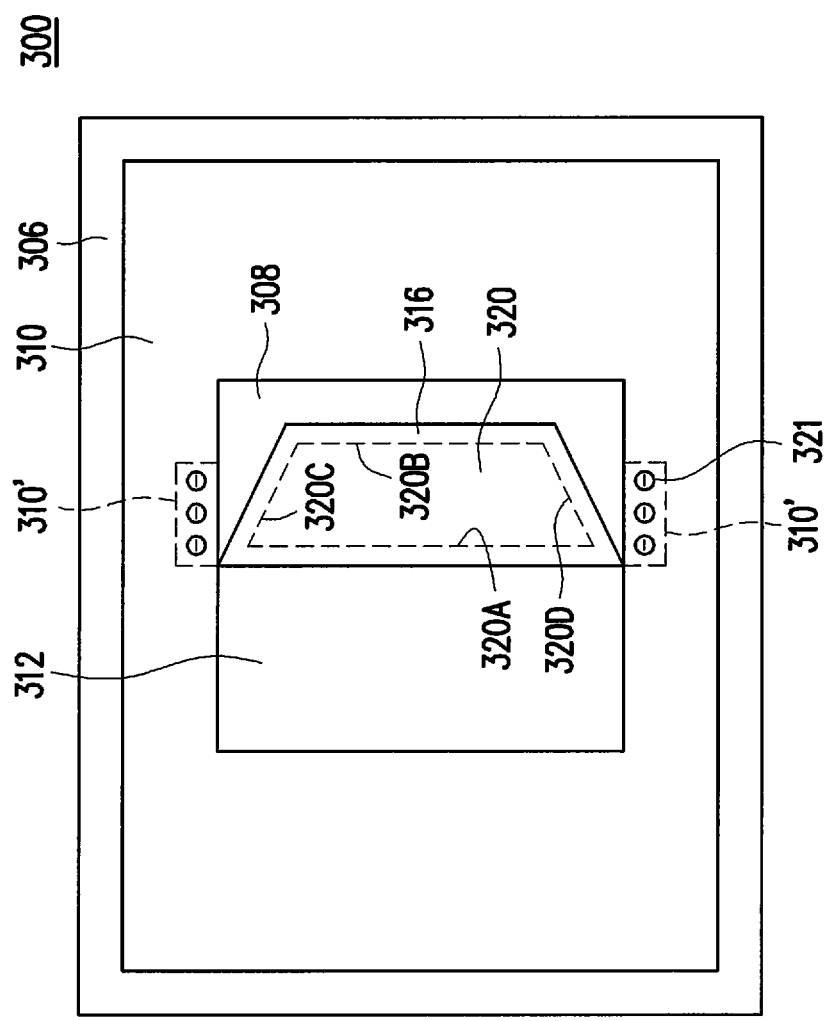

POWER METAL-OXIDE-SEMICONDUCTOR FIELD EFFECT TRANSISTOR

CROSS-REFERENCE TO RELATED APPLICATION

The present application is a divisional of U.S. patent application Ser. No. 15/665,007, filed Jul. 31, 2017, which is incorporated by reference herein in their entireties.

BACKGROUND

A power metal-oxide-semiconductor field-effect transistor (MOSFET) is a type of MOSFETs that is designed to handle significant power levels, such as high voltage levels and/or high current levels. Power MOSFETs can be used in various applications such as, for example, display drivers, power converters, motor controllers, vehicle power devices, etc. One type of power MOSFET is a laterally-diffused metal-oxide semiconductor (LDMOS) transistor. In general, an LDMOS transistor has various characteristics, for example, a high gain, a high power output, and a high efficiency at high frequencies, etc., so as to make the LDMOS transistor suitable to be used with microwave and radio frequency (RF) power amplifiers.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIGS. 3A, 3B, 3C, 3D, 3E, 3F, 3G, 3H, 3I, 3J, 3K, 3L, and 3M illustrate cross-sectional views of an exemplary LDMOS transistor, made by the method of FIG. 2, during various fabrication stages, in accordance with some embodiments.

FIGS. 6O and 6T respectively illustrate corresponding top views of the exemplary LDMOS FinFET of FIGS. 6M and 6R, in accordance with some embodiments.

DETAILED DESCRIPTION OF EXEMPLARY EMBODIMENTS

Figure 1A:
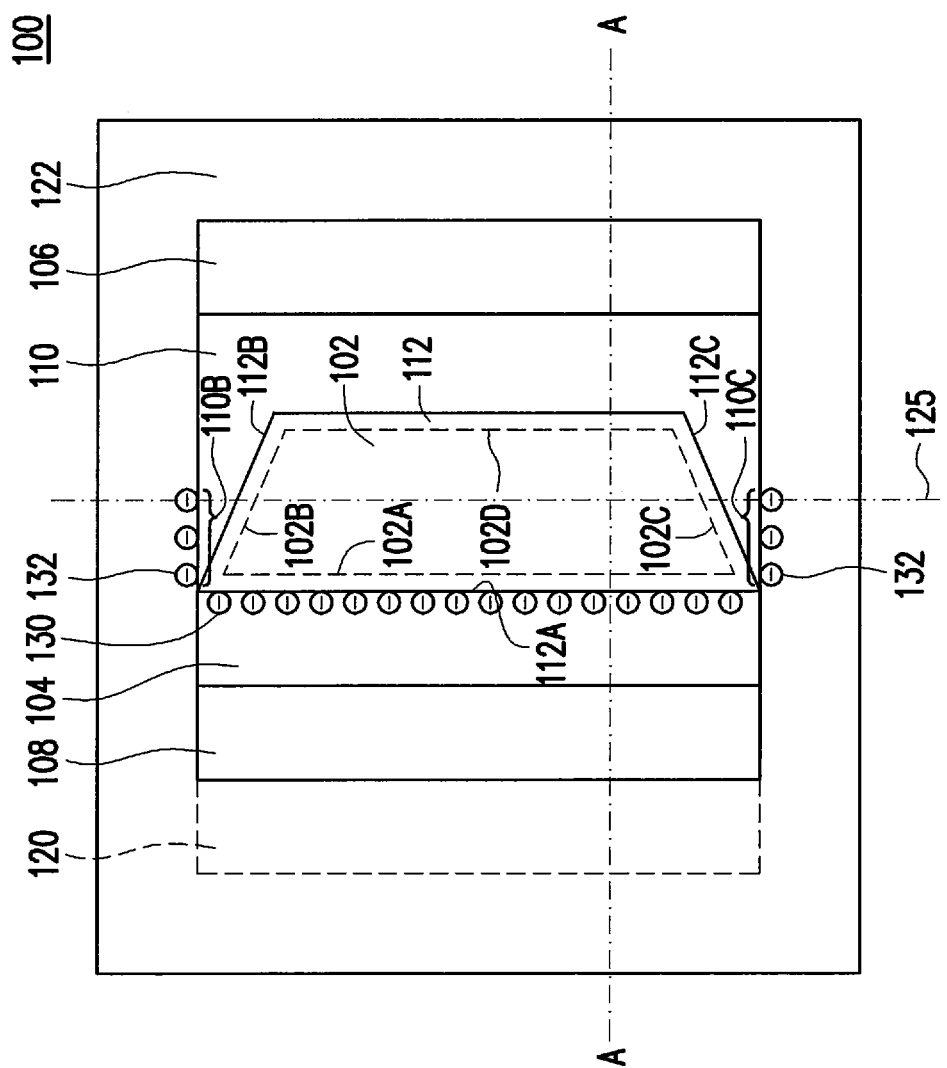
FIG. 1A illustrates a top view of a laterally-diffused metal-oxide semiconductor (LDMOS) transistor including an asymmetric gate electrode, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, performance of a laterally diffused metal-oxide-semiconductor (LDMOS) transistor is evaluated based on one or more of the LDMOS transistor's characteristics, e.g., a gain, a power output, an efficiency at high frequencies, etc. The one or more characteristics are typically determined based on the LDMOS transistor's ON resistance (i.e., an effective resistance of the LDMOS transistor when the LDMOS transistor is turned on), and, more specifically, the ON resistance is mainly determined based on the LDMOS transistor's respective channel resistance and drift resistance. Typically, when the LDMOS transistor is turned on for operation, a channel region and a drift region are formed in the LDMOS transistor so as to allow a plurality of carriers (e.g., electrons) to flow through the channel region and drift region, which are associated with the channel resistance and drift resistance, respectively.

In a conventional LDMOS transistor, respective channel and draft regions are typically formed to be arranged end-to-end, and extend laterally along an upper or a top surface of a semiconductor substrate from respective source contact region to drain contact region. The channel region is typically formed in a p-type semiconductor region where the source contact region is disposed, and the channel region extends laterally from the source contact region to the drift region. The drift region is typically formed in an n-type semiconductor region where the drain contact region is disposed, and the drift region extends laterally from the channel region to the drain contact region.

In the conventional LDMOS transistor, a gate electrode is typically disposed over the p-type semiconductor region where the channel region is to be formed. More specifically, when turning on the conventional LDMOS transistor, a high enough voltage (e.g., a positive voltage) is applied to the gate electrode to cause an upper portion of the p-type semiconductor region underlying the gate electrode to reverse its respective polarity (i.e., from the p-type to the n-type), which is typically known as an "inversion channel." Such an inversion channel can be used as the channel region for the conventional LDMOS transistor. During operation, a positive voltage is typically applied to the drain contact region with respect to the source contact region (i.e., a negative voltage is effectively seen from the source contact region), which causes such "inversed" carriers in the p-type semiconductor region (e.g., electrons) to flow from the source contact region, along the channel region, and to the drain contact region. As mentioned above, the drift region in the n-type semiconductor region further extends (e.g., couples) the channel region to the drain contact region, which is typically implemented as "drifting" a plurality of majority carriers (e.g., electrons) that are originally in the n-type semiconductor region (i.e., non-inversed/non-induced carriers) to the drain contact region using the positive voltage applied to the drain contact region. As such, the gate electrode's lateral location on the p-type semiconductor region may define the channel region's location, and, in turn, the drift region's location.

Such a laterally end-to-end configuration of the channel and drift regions in the conventional LDMOS transistor may encounter various issues. In an example, a distance laterally from the source contact region to the drain contact region is too long such that a respective pitch of the conventional LDMOS transistor during bulk manufacture is large. The large pitch, in turn, increases manufacturing costs since few LDMOS transistors can be accommodated within a limited area (e.g., a wafer). Moreover, the large pitch disadvantageously increases an ON resistance (i.e., increasing respective channel and drift resistances) of the conventional LDMOS transistor. In another example, no carriers (e.g., electrons) are further induced in the drift region, as mentioned above, which disadvantageously causes the drift region to become less conductive (i.e., increasing corresponding drift resistance). Due to at least one of the above-mentioned issues, the ON resistance of the conventional LDMOS transistor is accordingly large, which, in turn, causes the conventional LDMOS transistor to have a low gain, a low power output, a low efficiency, etc.

The present disclosure provides various embodiments of a novel LDMOS transistor including an asymmetric gate electrode. The asymmetrical gate electrode is laterally disposed between respective drain and source contact regions, and extends into a first semiconductor region that is disposed over a second semiconductor region. In some embodiments, the asymmetric gate electrode is "asymmetric" with respect to an axis that is aligned between the respective drain and source contact regions. More specifically, in some embodiments, the asymmetric gate electrode includes a first sidewall, a second sidewall, a third sidewall, and a fourth sidewall. The third and fourth sidewalls are coupled between the first and second sidewalls. The first and second sidewalls have respective different cross-sectional areas such that the third and fourth sidewalls are tilted toward each other, when viewing from the top.

As such, in some embodiments, together with plural inversed carriers (e.g., electrons) that can be induced in a substantially vertical channel region in the first semiconductor region extending along the first sidewall, additional carriers (e.g., electrons) may be induced in the second semiconductor region and along at least part of the third and fourth sidewalls (i.e., the sidewalls tilted toward each other), which will be discussed in further detail below. Those additionally induced carriers in the second semiconductor region may advantageously decrease a respective drift resistance of the disclosed LDMOS transistor, which, in turn, decreases a total ON resistance of the disclosed LDMOS transistor. Thus, the disclosed LDMOS transistor can provide various advantages over the conventional LDMOS transistor such as, for example, a higher gain, a higher power output, a higher efficiency, or a combination thereof.

Figure 1B:
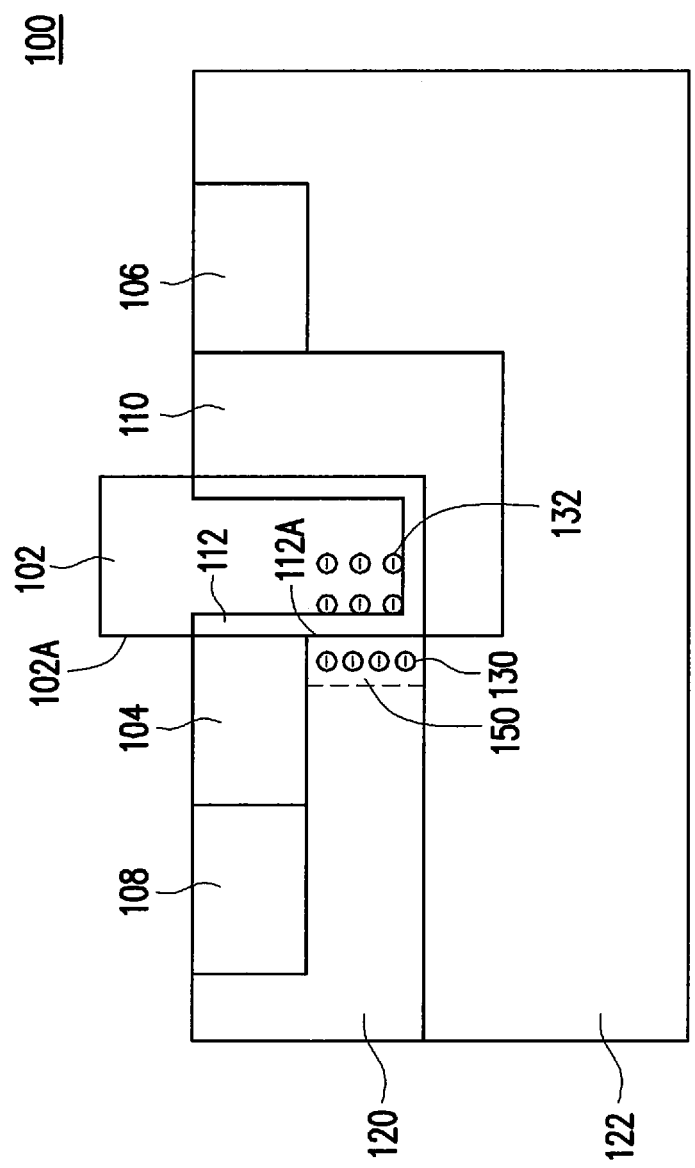
FIG. 1B illustrates a cross-sectional view of the LDMOS transistor of FIG. 1A, in accordance with some embodiments.

FIG. 1A illustrates a top view of an embodiment of a disclosed laterally-diffused metal-oxide semiconductor (LDMOS) transistor 100 that includes an asymmetric gate electrode 102. FIG. 1B illustrates a corresponding cross-sectional view of the LDMOS transistor 100 taken across line A-A. As shown in the illustrated embodiment of FIG. 1A, the LDMOS transistor 100 includes the asymmetric gate electrode 102, a source contact region 104, a drain contact region 106, a body contact region 108, an isolation region 110, a gate dielectric layer 112, a first semiconductor region 120 (shown in dotted lines), and a second semiconductor region 122. In some embodiments, the gate dielectric layer 112 may surround a lower portion of the asymmetric gate electrode 102 and may be invisible when viewing from the top. Thus, the gate dielectric layer 112 is shown in dotted lines in FIG. 1A. The gate dielectric layer 112 can be better seen in the cross-sectional view of FIG. 1B.

As mentioned above, the asymmetric gate electrode 102 is asymmetric with respect to an axis (e.g., 125) aligned between the LDMOS transistor 100's respective source contact region 104 and drain contact region 106. In some embodiments, such an axis 125 may be perpendicular to a lateral direction, or an axis, along which the source contact region 104 and the drain contact region 106 are relatively disposed. Although in the illustrated embodiment of FIG. 1A, the asymmetric gate electrode 102 is formed as a trapezoidal shape when viewing from the top, it is noted that the asymmetric gate electrode 102 can be formed as any of a variety of polygonal or curvilinear shapes that are asymmetric with respect to the axis 125 while remaining within the scope of the present disclosure.

For example, in an alternative embodiment, the asymmetric gate electrode 102 may be formed as a triangle, wherein a first side of the triangle is parallel with the axis 125 and relatively adjacent to the source contact region 104, and a corresponding angle opposite to the first side is relatively adjacent to drain contact region 106. As such, when viewing from the top, two other sides (second and third sides of the triangle) merges with each other at respective ends relatively adjacent to the drain contact region 106.

In the illustrated embodiment of FIG. 1A, the asymmetric gate electrode 102 has four sides 102A, 102B, 102C, and 102D. Since the asymmetric gate electrode 102 is a three-dimensional structure extending into the isolation region 110 (as will be shown in FIG. 1B), the sides 102A, 102B, 102C, and 102D are herein referred to as sidewalls 102A, 102B, 102C, and 102D, respectively. In some embodiments, the sidewall 102A is relatively adjacent to the source contact region 104. The sidewall 102D, opposite to the sidewall 102A, is relatively adjacent to the drain contact region 106. And the sidewalls 102B and 102C respectively couple the sidewall 102A to the sidewall 102D. Since, in accordance with some embodiments, a cross-sectional area of the sidewall 102D is relatively smaller than a cross-sectional area of the sidewall 102A, the sidewalls 102B and 102C are tilted toward each other, at respective ends that are closer to the drain contact region 106, when viewing from the top.

Referring now to FIG. 1B, the cross-sectional view of the LDMOS transistor 100 taken across the line A-A is shown. In some embodiments, the first semiconductor region 120 includes a well structure formed over the second semiconductor region 122. As will be discussed in further detail below, the first and second semiconductor regions 120 and 122 are doped with respective different doping types, for example, p-type and n-type. The first semiconductor region 120 has a lower or bottom boundary that is vertically spaced above a lower or bottom boundary of the second semiconductor region 122 and, in some embodiments, has an upper or top boundary that is about even with an upper or top boundary of the second semiconductor region 122.

The body contact region 108 and the source contact region 104 are arranged over the first semiconductor region 120, and respectively have different doping types, for example, p-type and n-type. In some embodiments, the body contact region 108 and the source contact region 110 have lower or bottom boundaries that are vertically spaced above the lower or bottom boundary of the first semiconductor region 120 and, in some embodiments, have upper or top boundaries that are about even with the upper or top boundary of the first semiconductor region 120. Further, the body contact region 108 and the source contact region 104 have elevated doping concentrations relative to the first semiconductor region 120.

The drain contact region 106 is arranged over the second semiconductor region 122, and has the same doping type as the second semiconductor region 122 (e.g., n-type) but with a doping concentration elevated relative to the second semiconductor region 122. The drain contact region 106 is laterally spaced from the body contact region 108 with the source contact region 104 arranged laterally between the body contact region 108 and the drain contact region 106. Further, the drain contact region 106 has a lower or bottom boundary that is vertically spaced above the lower or bottom boundary of the first semiconductor region 120 and, in some embodiments, has an upper or top boundary that is about even with the upper or top boundary of the first semiconductor region 120.

The asymmetric gate electrode 102 is arranged adjacent to the first semiconductor region 120, laterally between the source contact region 104 and drain contact region 106. The asymmetric gate electrode 102 extends vertically along a side boundary of the first semiconductor region 120 to below the source contact region 104, thereby coupling itself to the first semiconductor region 120 via the gate dielectric layer 112, which may be used to form a channel region 150 of the LDMOS transistor 100. The formation of the channel region 150 will be discussed in further detail below. In some embodiments, the asymmetric gate electrode 102 is insulated from the source contact region 104, the drain contact region 106, the first semiconductor region 120, and/or the second semiconductor regions 122 by the gate dielectric layer 112 lining (e.g., surrounding) a lower portion of the asymmetric gate electrode 102 and/or the isolation region 110 into which the asymmetric gate electrode 102 extends.

In some embodiments, when the LDMOS transistor 100 is turned on, a plurality of inversed carriers 130 (e.g., electrons), shown in both FIGS. 1A and 1B, are induced in the first semiconductor region 120, and, more specifically, along a substantially vertical sidewall of the first semiconductor region 120 that is substantially adjacent to a sidewall 112A of the gate dielectric layer 112. In some embodiments, the sidewall 112A of the gate dielectric layer 112 is aligned with the sidewall 102A of the asymmetric gate electrode 102. Since the inversed carries 130 are formed along a vertical projection of the sidewall 102A of the asymmetric gate electrode 102, in the following discussions, the inversed carries 130 are referred to as formed along the sidewall 102A of the asymmetric gate electrode 102. When the plurality of inversed carriers 130 are induced along the sidewall 102A of the asymmetric gate electrode 102, the LDMOS transistor 100's channel region 150 is formed, according to some embodiments.

Further, in accordance with various embodiments of the present disclosure, a plurality of carriers 132 (e.g., electrons), shown in both FIGS. 1A and 1B, may be induced in the second semiconductor region 122 along portions of sidewalls of the isolation region 110, for example, 110B and 110C shown in FIG. 1A. In some embodiments, the portions 110B and 110C of the sidewalls of the isolation region 110 may be relatively adjacent to sidewalls 112B and 112C of the gate dielectric layer 112, respectively. The sidewall 112B of the gate dielectric layer 112 is in contact with a lower portion of the sidewall 102B; and the sidewall 112C of the gate dielectric layer 112 is in contact with a lower portion of the sidewall 102C. Since the induced carries 132 are substantially adjacent to, at least part of, the sidewalls 102B and 102C of the asymmetric gate electrode 102, in the following discussions, the induced carries 132 are referred to as formed along the sidewalls 102B and 102C of the asymmetric gate electrode 102.

The whole second semiconductor region 122 where the carriers 132 are induced is typically referred to as the LDMOS transistor 100's drift region. In some embodiments, the carriers 132 are "additionally" induced in such a drift region where a plurality of majority carriers (e.g., electrons) have already existed. In some embodiments, such additional carriers 132 may be due to the asymmetric geometry of the asymmetric gate electrode 102, which will be discussed in further detail below. As mentioned above, such a drift region is configured to couple the LDMOS transistor 100's channel region from the source contact region 104 to the drain contact region 106. By additionally inducing the carriers 132 in the drift region, in some embodiments, a drift resistance associated with the drain region may be substantially reduced, which, in turn, reduces an ON resistance of the LDMOS transistor 100 Thus, at least some of the above-mentioned advantages (e.g., a higher gain, a higher power output, a higher efficiency, etc.) can be reached in the LDMOS transistor 100.

Figure 2:
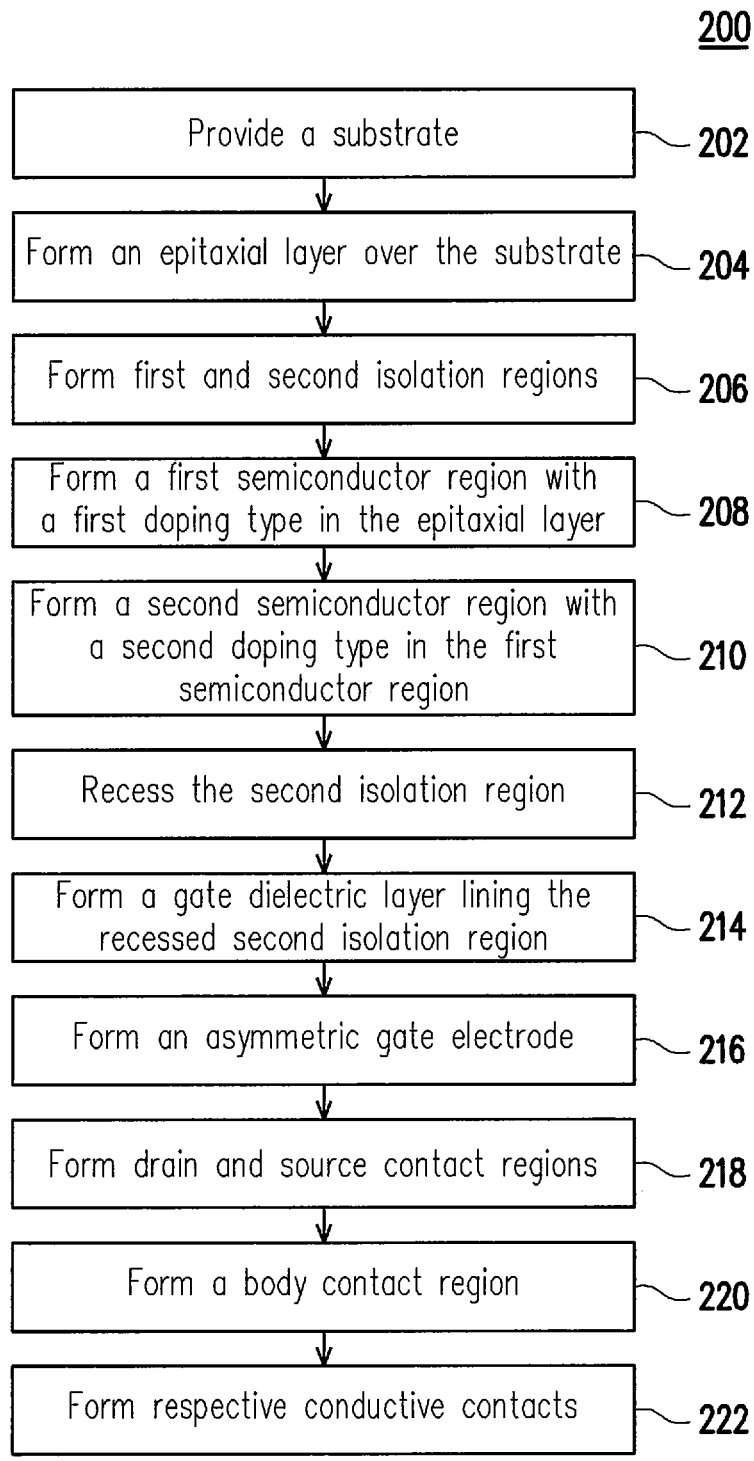
FIG. 2 illustrates a flow chart of a method to form the LDMOS transistor of FIGS. 1A-1B, in accordance with some embodiments, in accordance with some embodiments.

FIG. 2 illustrates a flowchart of an exemplary method 200 to form a semiconductor device according to one or more embodiments of the present disclosure. It is noted that the method 100 is merely an example, and is not intended to limit the present disclosure. In some embodiments, the semiconductor device is, at least part of, an LDMOS transistor with an asymmetric gate electrode as shown in FIGS. 1A-1B. It is noted that the method of FIG. 2 does not produce a completed LDMOS transistor. A completed LDMOS transistor may be fabricated using complementary metal-oxide-semiconductor (CMOS) technology processing. Accordingly, it is understood that additional operations may be provided before, during, and after the method 200 of FIG. 2, and that some other operations may only be briefly described herein.

Referring to FIG. 2, in some embodiments, the method 200 starts with operation 202 in which a substrate is provided. The method 200 proceeds to operation 204 in which at least an epitaxial layer is formed on the substrate. The method 200 proceeds to operation 206 in which a first isolation region and a second isolation region are formed. The first and second isolation regions are each formed over the epitaxial layer, and more specifically, each extends into the epitaxial layer. In some embodiments, the first isolation region is configured to laterally surround a periphery of an active device region where the LDMOS transistor is to be formed; and the second isolation region is included in the active device region and is further configured to isolate respective drain and source contact regions of the LDMOS transistor.

The method 200 proceeds to operation 208 in which a first semiconductor region doped with a first doping type is formed in the epitaxial layer. In some embodiments, the first semiconductor region is surrounded by the first isolation region. The method 200 proceeds to operation 210 in which a second semiconductor region doped with a second doping type is formed in the first semiconductor region. The first doping type is different from the second doping type. In some embodiments, the first and second semiconductor regions are each formed as a well structure, wherein first semiconductor region extends through the epitaxial layer (i.e., extending to an upper boundary of the substrate/a lower boundary of the epitaxial layer), and the second semiconductor region extends partially through the first semiconductor region (i.e., not extending to the lower boundary of the epitaxial layer), which will be discussed and illustrated below.

The method 200 proceeds to operation 212 in which the second isolation region is recessed. According to some embodiments, the second isolation region is recessed (e.g., etched) to form a trench that extends below a lower boundary of the second semiconductor region when viewing cross-sectionally, and has a polygonal shape when viewing from the top. The second isolation region with such a polygonal shape trench can be used to form an asymmetric gate electrode (e.g., 102) as illustrated above in FIGS. 1A-1B. The method 200 proceeds to operation 214 in which a gate dielectric layer is formed to line the recessed second isolation region. The method 200 proceeds to operation 216 in which an asymmetric gate electrode is formed. In some embodiments, the asymmetric gate electrode is formed by refilling the recessed second isolation region, which has a polygonal shape when viewing from the top, with at least a suitable gate stack material (e.g., polysilicon and/or metal material).

Referring still to FIG. 2, the method 200 continued to operation 218 in which drain and source contact regions are formed. In some embodiments, the drain and source contact regions are formed in the first and second semiconductor regions, respectively, and laterally spaced from each other by the second isolation region and the asymmetric gate electrode. In some embodiments, the drain and source contact regions are, simultaneously or respectively, doped with the same first doping type in an elevated doping concentration when compared to the first semiconductor region. The method 200 continued to operation 220 in which a body contact region is formed. In some embodiments, the body contact region is formed in the second semiconductor region and adjacent to the source contact region. In some embodiments, the body contact region is doped with the second doping type in an elevated doping concentration when compared to the second semiconductor region. The method 200 continued to operation 222 in which respective conductive contacts for the asymmetric gate electrode, the drain contact region, the source contact region, and the body contact region are formed.

Figure 3A:
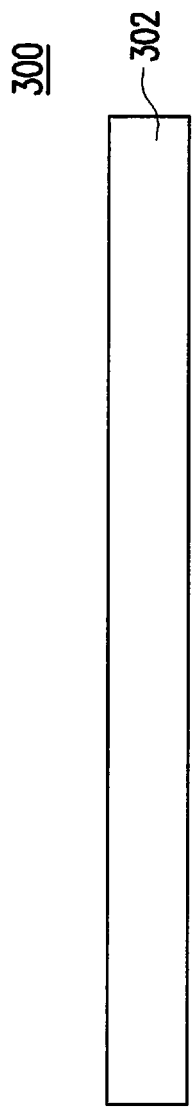
Figure 3B:
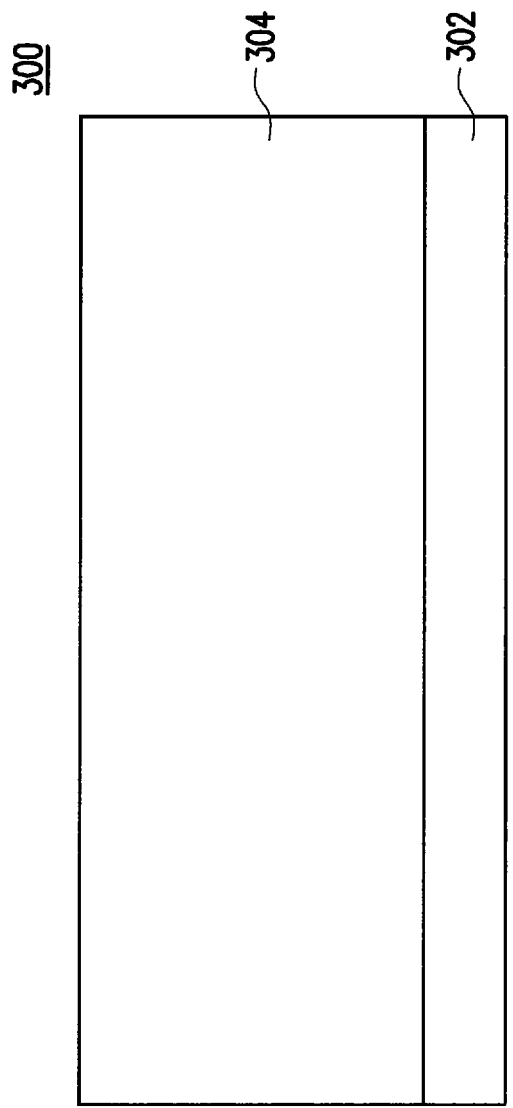
Figure 3C:
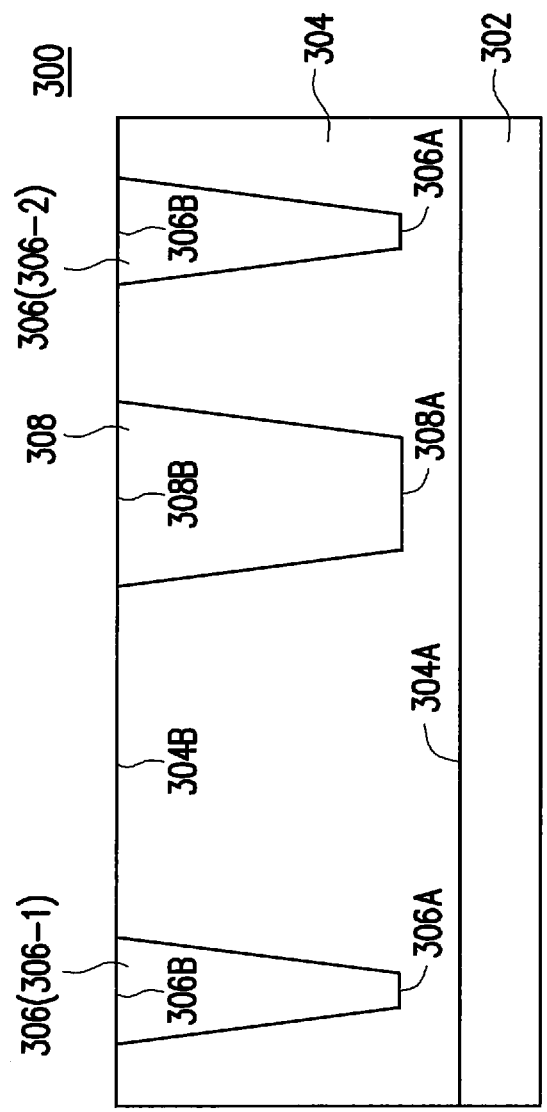
Figure 3D:
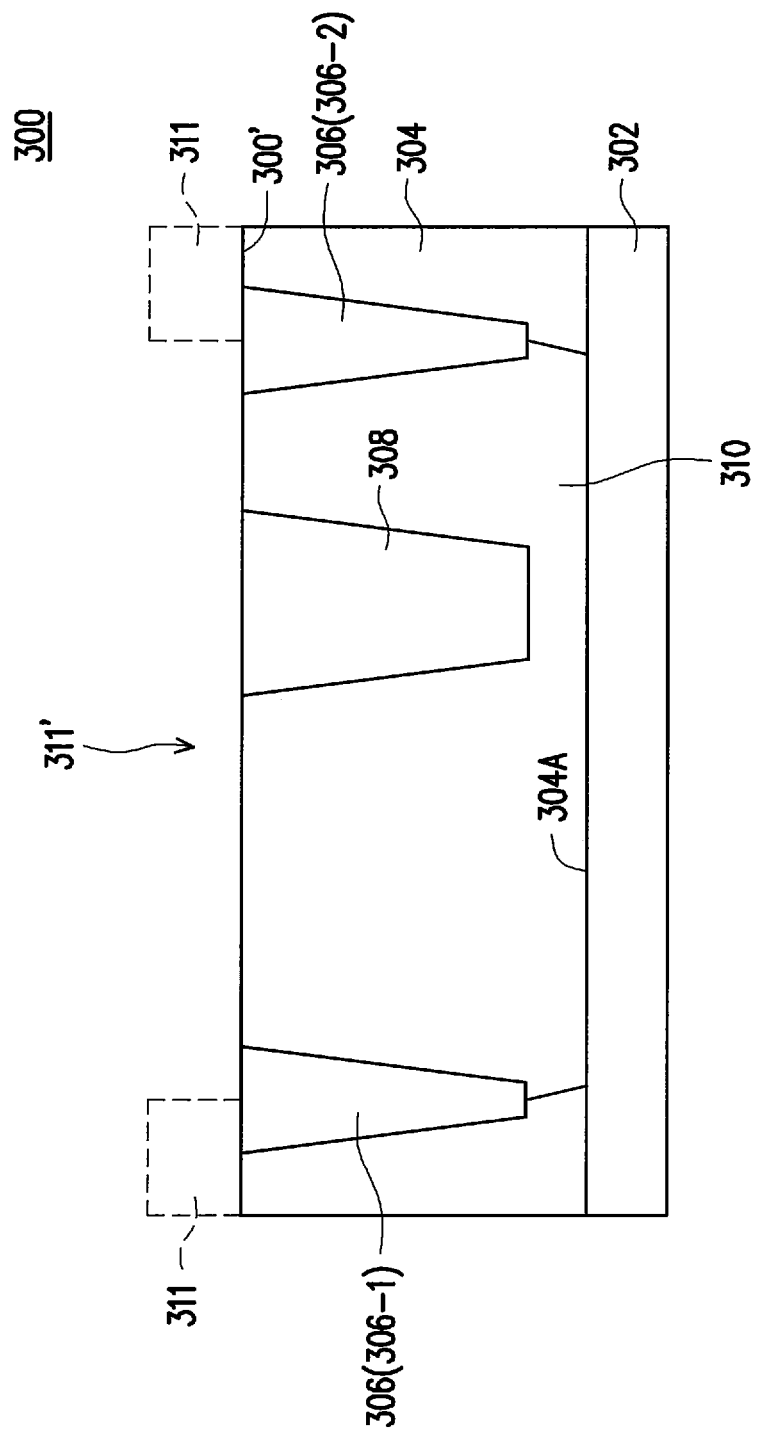
Figure 3E:
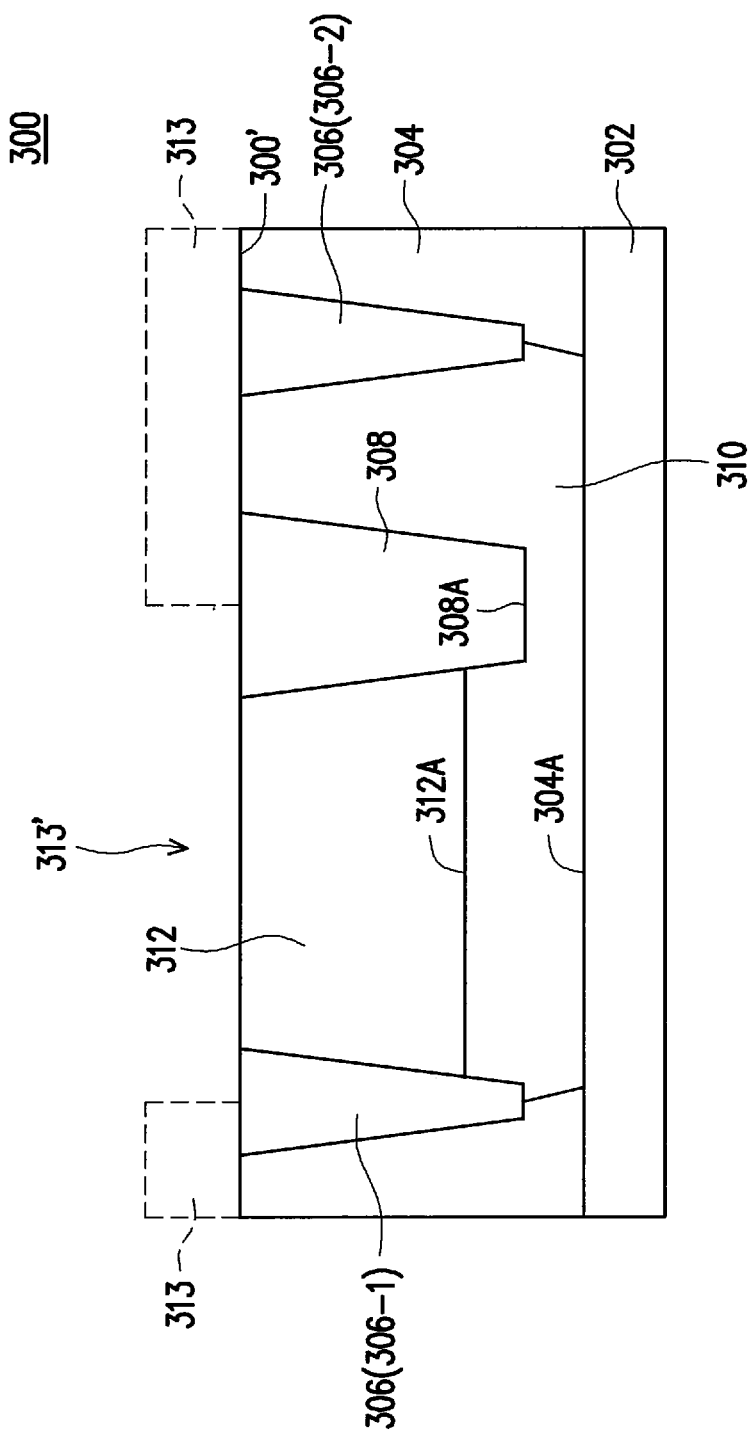
Figure 3F:
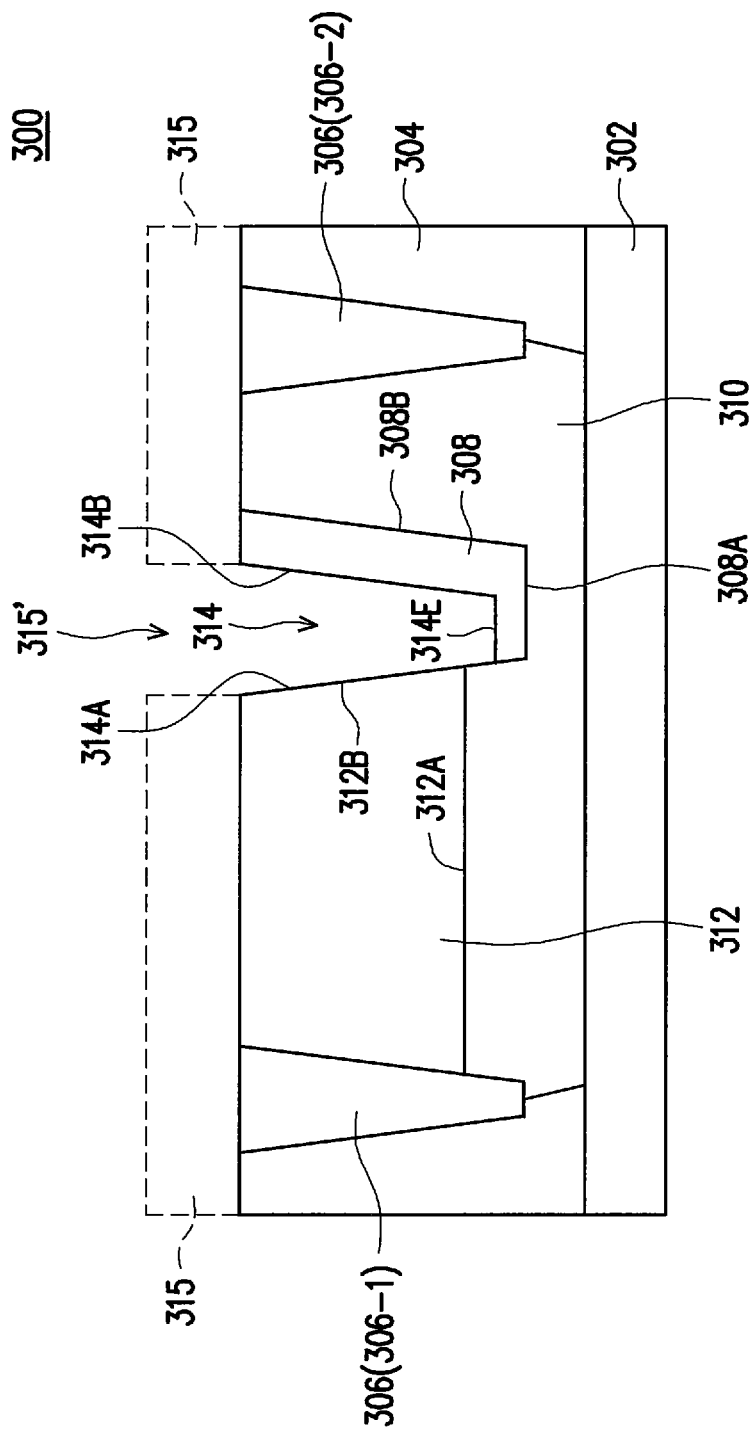
Figure 3G:
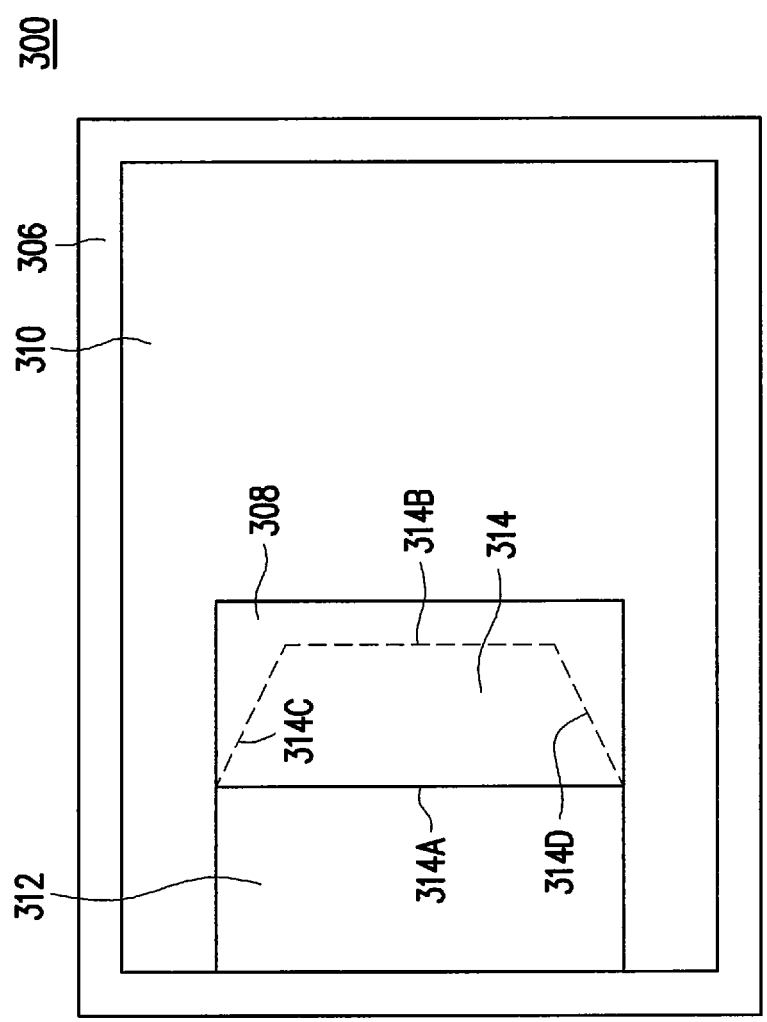

In some embodiments, operations of the method 200 may be associated with cross-sectional views of a semiconductor device 300 at various fabrication stages as shown in FIGS. 3A, 3B, 3C, 3D, 3E, 3F, 3H, 3I, 3K, 3L, and 3M, respectively. For purpose of clarity of illustration, top views corresponding to the cross-sectional view in FIGS. 3F and 3I are illustrated in FIGS. 3G and 3J, respectively.

In some embodiments, the semiconductor device 300 may be an LDMOS transistor that is substantially similar to the LDMOS transistor 100 of FIGS. 1A-1B. The LDMOS transistor 300 may be included in a circuit such as, for example, a microprocessor, a memory cell, and/or an integrated circuit (IC). Also, FIGS. 3A through 3M are simplified for a better understanding of the concepts of the present disclosure. For example, although the figures illustrate the LDMOS transistor 300, it is understood the circuit containing the LDMOS transistor 300 may comprise a number of other devices comprising resistors, capacitors, inductors, fuses, etc., which are not shown in FIGS. 3A through 3M, for purposes of clarity of illustration.

Corresponding to operation 202 of FIG. 2, FIG. 3A is a cross-sectional view of the LDMOS transistor 300 including a substrate 302 at one of the various stages of fabrication, according to some embodiments. The substrate 302 includes a silicon substrate. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. The substrate 302 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

Corresponding to operation 204 of FIG. 2, FIG. 3B is a cross-sectional view of the LDMOS transistor 300 including at least one epitaxial layer 304 formed on the substrate 302 at one of the various stages of fabrication, according to some embodiments. The epitaxial layer 304 may include, for example, a monocrystalline silicon layer. Further, the epitaxial layer 304 may be, for example, un-doped or may be doped with have a first doping type (e.g., n-type). In some embodiments, the epitaxial layer 304 may be formed by using at least one of molecular beam epitaxy (MBE), chemical vapor deposition (CVD), physical vapor deposition (PVD), spin-on coating, and/or other suitable techniques to deposit one of the above-mentioned materials (e.g., monocrystalline silicon) on the substrate 302.

Corresponding to operation 206 of FIG. 2, FIG. 3C is a cross-sectional view of the LDMOS transistor 300 including a first isolation region 306 and a second isolation region 308, which are formed, at one of the various stages of fabrication, according to some embodiments. In some embodiments, the first isolation region 306 is formed to laterally surround an active device region of the LDMOS transistor 300. Thus, although, in the illustrated embodiment of FIG. 3C, the first isolation region 306 includes two portions (e.g., 306-1 and 306-2) spaced apart from each other, it is understood that the portions 306-1 and 306-2 may be coupled to each other when viewing from the top. In some embodiments, the second isolation region 308 is disposed within such an active device region surrounded by the first isolation region 306.

As shown in the illustrated embodiment of FIG. 3C, the first and second isolation regions 306 and 308 each extends partially through the epitaxial layer 304 to cause respective lower boundaries 306A and 308B to be disposed above a lower boundary 304A of the epitaxial layer 304. Further, in some embodiments, each of the first and second isolation regions 306 and 308 has an upper boundary (e.g., 306B and 308B) abutting an upper boundary 304B of the epitaxial layer 304. In some embodiments, each of the first and second isolation regions 306 and 308 may be a shallow trench isolation (STI) feature. In some alternative embodiments, the first and second isolation regions 306 and 308 may each be a deep trench isolation (DTI) feature, which will be discussed in further detail below with respect to FIGS. 4B, 4C, and 4D.

In some embodiments, each of the first and second isolation regions 306 and 308 may be formed by at least some of the following processes: recessing the epitaxial layer 304 using one or more dry/wet etching techniques; refilling the recessed epitaxial layer 304 with a dielectric material (e.g., silicon oxide ($SiO_2$)) using CVD and/or PVD techniques; and removing excessive dielectric material using a polishing technique (e.g., a chemical-mechanical polishing (CMP)).

Corresponding to operation 208 of FIG. 2, FIG. 3D is a cross-sectional view of the LDMOS transistor 300 including a first semiconductor region 310, which is formed at one of the various stages of fabrication, according to some embodiments. In some embodiments, the first semiconductor region 310 is doped with the first doping type (n-type) of dopants, e.g., phosphorous (P), arsenic (As), antimony (Sb), etc. In some embodiments, the first semiconductor region 310 is formed in the epitaxial layer 304, and, more specifically, to extend through the epitaxial layer 304. As such, the first semiconductor region 310's lower boundary is aligned with the lower boundary 304A of the epitaxial layer 304. In some alternative embodiments, the first semiconductor region 310's lower boundary may be formed to be above the lower boundary 304A of the epitaxial layer 304.

In some embodiments, the first semiconductor region 310 may be formed by at least some of the following processes: forming a removable layer (e.g., a photoresist layer, a hardmask layer, etc.) 311 over an upper boundary 300' of the LDMOS transistor 300 that includes a pattern 311' aligned with the active device area surrounded by the first isolation region 306; performing a doping process (e.g., an ion implantation process, a diffusion process, etc.) to incorporate a plurality of the first doping type (n-type) of dopants into the epitaxial layer 304; removing the removable layer 311; and performing an optional annealing process to activate the incorporated dopants.

Corresponding to operation 210 of FIG. 2, FIG. 3E is a cross-sectional view of the LDMOS transistor 300 including a second semiconductor region 312, which is formed at one of the various stages of fabrication, according to some embodiments. In some embodiments, the second semiconductor region 312 is doped with a second doping type of dopants, different from the first doping type—e.g., p-type. Exemplary p-type dopants include boron (B), gallium (Ga), aluminum (Al), etc.

In some embodiments, the second semiconductor region 312 is formed in the first semiconductor region 310. The second semiconductor region 312 extends partially through the first semiconductor region 310 (i.e., not extending to the boundary 304A), and, more specifically, the second semiconductor region 312 does not extend to reach the lower boundary 308A, either. Alternatively stated, in some embodiments, the second semiconductor region 312's lower boundary 312A is disposed above the lower boundary 308A of the second isolation region 308. In some embodiments, the second semiconductor region 312 is laterally disposed between the first portion 306-1 of the first isolation region 306 and the second isolation region 308. More specifically, when viewing from the top, the second semiconductor region 312 may be surrounded by the first portion 306-1, the second isolation region 308, and the first semiconductor region 310.

In some embodiments, the second semiconductor region 312 may be formed by at least some of the following processes: forming a removable layer (e.g., a photoresist layer, a hardmask layer, etc.) 313 over the upper boundary 300' that includes a pattern 313' aligned with an area that is surrounded by the first portion 306-1, the second isolation region 308, and the first semiconductor region 310 (i.e., an area in the first semiconductor region 310 where the second semiconductor region 312 is intended to be formed); performing a doping process (e.g., an ion implantation process, a diffusion process, etc.) to incorporate a plurality of dopants with the second doping type (p-type) into the first semiconductor region 310; removing the removable layer 313; and performing an optional annealing process to activate the incorporated dopants.

Corresponding to operation 212 of FIG. 2, FIG. 3F is a cross-sectional view of the LDMOS transistor 300 in which the second isolation region 308 is recessed at one of the various stages of fabrication, according to some embodiments, and FIG. 3G is the corresponding top view of the LDMOS transistor 300 of FIG. 3F.

Referring first to FIG. 3F, the second isolation region 308 is recessed to form a trench 314. In some embodiments, the trench 314 is formed to have sidewalls 314A and 314B that have respective different cross-sectional areas, which will be disused with respect to FIG. 3G, and a lower boundary 314E. More specifically, in some embodiments, the trench 314 is formed to be laterally adjacent to the second semiconductor region 312, which causes the sidewall 314A to be substantially adjacent to a sidewall 312B of the second semiconductor region 312, or in direct contact with the sidewall 312B (exposing the sidewall 312B) as shown in FIG. 3, and causes the sidewall 314B to be laterally spaced from a sidewall 308B of the second isolation region 308 by a portion of the second isolation region 308. Still more specifically, in some embodiments, the trench 314 extends partially through the second isolation region 308, which causes the lower boundary 314E to be vertically above the lower boundary 308A of the second isolation region 308. Although, in the illustrated embodiment of FIG. 3F, the lower boundary 314E is disposed below the lower boundary 312A of the second semiconductor region 312, it is noted that the lower boundary 314E may be aligned with or disposed above the lower boundary 312A while remaining within the scope of the present disclosure.

Referring then to the top view of FIG. 3G, two sidewalls 314C and 314D of the trench 314 are further shown. It is noted that, for purposes of clarity of illustration, the epitaxial layer 304 (i.e., the area not surrounded by the first isolation region 306) is not shown in FIG. 3G. In some embodiments, the sidewalls 314C and 314D are each coupled between the sidewalls 314A and 314B. As mentioned above, the sidewalls 314A and 314B have respective different cross-sectional areas. In some embodiments, the sidewall 314A that is relatively adjacent to the second semiconductor region 312 has a greater cross-sectional area than the sidewall that is relatively farther from the second semiconductor region 312. Thus, in the top view of FIG. 3G, the sidewall 314A is "wider" than the sidewall 314B. Due to the difference between the respective cross-sectional areas of the sidewalls 314A and 314B, the sidewalls 314C and 314D, coupling between the 314A and 314B, are tilted toward each other, in accordance with some embodiments.

In some embodiments, the trench 314 with such different dimensions of sidewalls may be formed by at least some of the following processes: forming a removable layer (e.g., a photoresist layer, a hardmask layer, etc.) 315 over the upper boundary 300' that includes a pattern 315' above a portion of the second isolation region 308 that is closer to, or in contact with, the second semiconductor region 312 and having a desired geometric shape (e.g., having respective sides with different dimensions); performing one or more dry/wet etching processes with the removable layer 315 as a mask to recess the second isolation region 308; removing the removable layer 315; and performing a cleaning process to remove a residue of the removable layer 315.

Figure 3H:
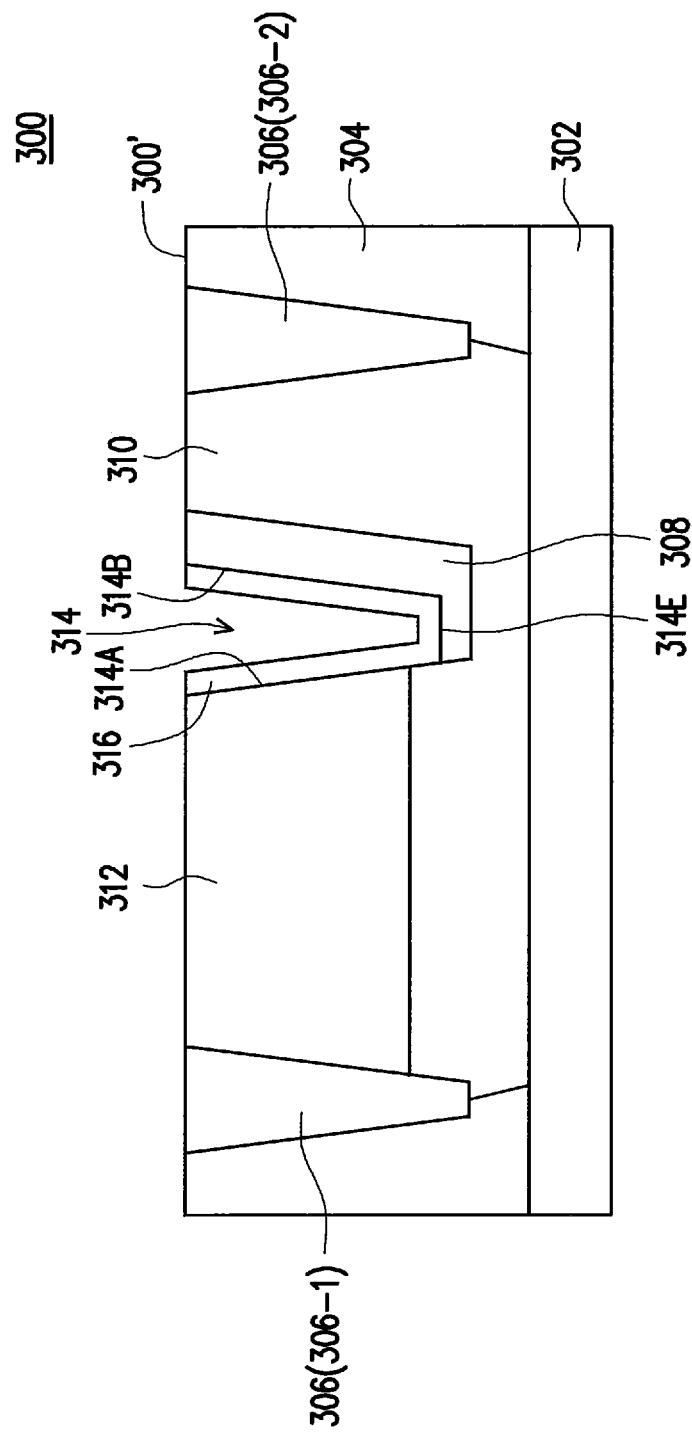
Figure 31:
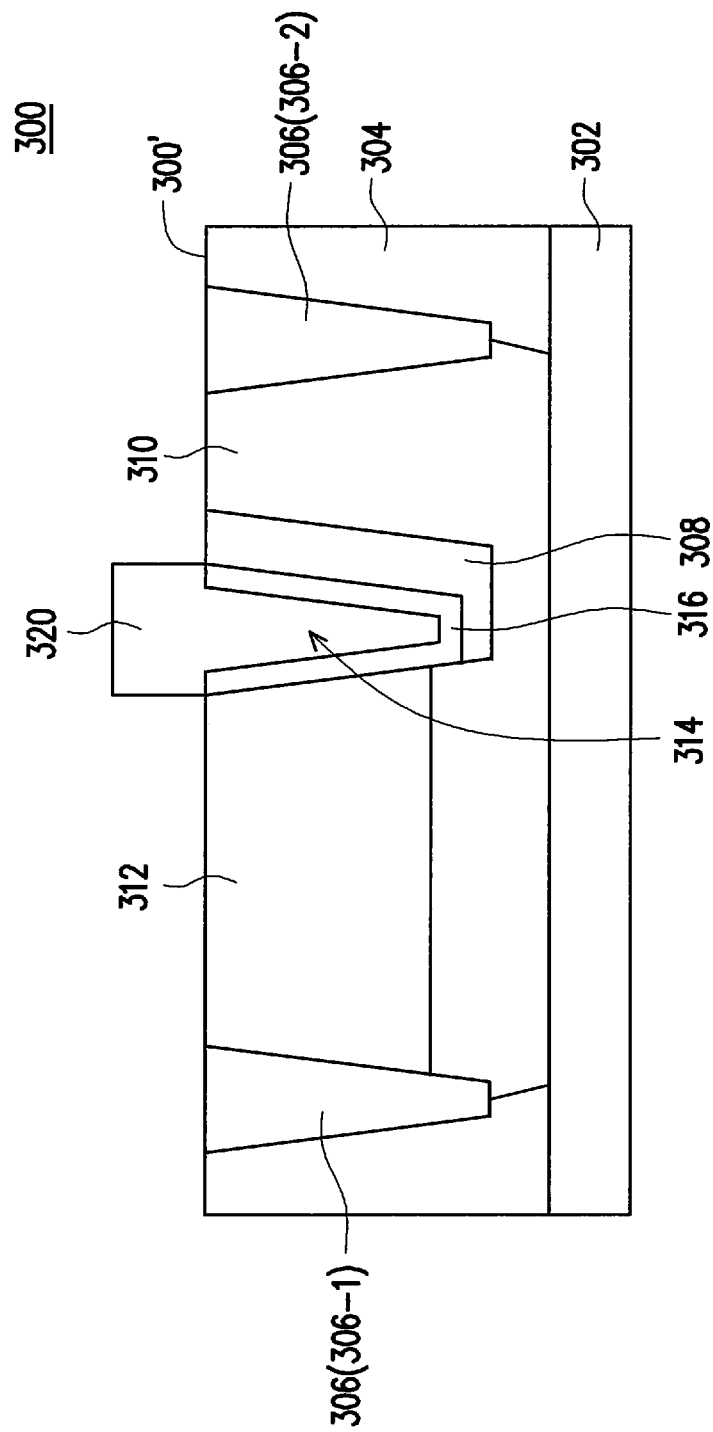

Corresponding to operation 214 of FIG. 2, FIG. 3H is a cross-sectional view of the LDMOS transistor 300 including a gate dielectric layer 316 lining the trench 314 at one of the various stages of fabrication, according to some embodiments. The gate dielectric layer 316 is formed as a thin layer, typically with a thickness of about 0.5 nanometers (nm) to 5 nm, to surround the sidewalls 314A-314D and the lower boundary 314E. As such, the geometric shape of the trench 314 may remain, i.e., even lined by the gate dielectric layer 316, the trench 314 still has respective sidewalls 314A and 314B with different cross-sectional areas and 314C and 314D tilted toward each other.

In some embodiments, the gate dielectric layer 314 includes a dielectric material such as, for example, silicon oxide ($SiO_2$), a high-k dielectric material (e.g., $HfO_2$, $Al_2O_3$, BaO, $La_2O_3$, etc.), or a combination thereof. In some embodiments, the gate dielectric layer 316 may be formed by at least some of the following processes: forming at least one of the above-mentioned dielectric materials over the upper boundary 300' thereby lining the trench 314; and removing a portion of the dielectric material that is disposed over the upper boundary 300' but remaining a portion of the dielectric material that lines the trench 314.

Corresponding to operation 216 of FIG. 2, FIG. 3I is a cross-sectional view of the LDMOS transistor 300 including an asymmetric gate electrode 320, which is formed at one of the various stages of fabrication, according to some embodiments, and FIG. 3J is the corresponding top view of the LDMOS transistor 300 of FIG. 3I. In some embodiments, the asymmetric gate electrode 320 is formed by depositing one or more conductive materials (e.g., a polysilicon material and/or metal materials) over the upper boundary 300' to refill the trench 314 with the one or more conductive materials, and patterning the one or more conductive materials to remove a portion of the one or more conductive materials not overlaying trench 314 and the gate dielectric layer 316.

In some alternative embodiments, the asymmetric gate electrode 320 may be formed concurrently with the gate dielectric layer 316. In such an alternative embodiment, the dielectric layer, used to form the gate dielectric layer 316, and the one or more conductive materials, used to form the asymmetric gate electrode 320, are sequentially deposited over the upper boundary 300' to line the trench 314. Then, one or more patterning processes are performed to remove respective portions of the dielectric material and the one or more conductive materials that are not overlays trench 314. Although, in the illustrated embodiment of FIG. 3I, the asymmetric gate electrode 320 protrudes beyond the upper boundary 300', it is noted that the asymmetric gate electrode 320 may have a top boundary substantially aligned with the upper boundary 300' while remaining within the scope of the present disclosure.

As mentioned above, since the geometric shape of the trench 314 remains after the formation of the gate dielectric layer 316, in some embodiments, the asymmetric gate electrode 320 can follow the geometric shape of the trench 314. A corresponding geometric shape of the asymmetric gate electrode 320 can be better seen from the top view of LDMOS transistor 300 shown in FIG. 3J. Similar to FIG. 3G, for purposes of clarity of illustration, the area not surrounded by the first isolation region 306 is not shown in FIG. 3J.

As shown in FIG. 3J, the asymmetric gate electrode 320 is formed as a trapezoidal shape. As mentioned above, however, the asymmetric gate electrode 320 can be formed as any of a variety of polygonal shapes while remaining within the scope of the present disclosure. In the example where the asymmetric gate electrode 320 is formed as a trapezoidal shape, the asymmetric gate electrode 320 has sidewalls 320A, 320B, 320C, and 320D. In some embodiments, the sidewalls 320A, 320B, 320C, and 320D may be each parallel to the sidewalls 314A, 314B, 314 C, and 314D of the trench 314, respectively (FIG. 3G). Further, the sidewall 320A has a greater cross-sectional area than the sidewall 320B does, which causes the sidewalls 320C and 320D to be tilted toward each other at respective ends closer to the sidewall 320B.

As mentioned above with respect to FIGS. 1A-1B, the asymmetric geometry of the asymmetric gate electrode 102 can induce additional carriers 132 in the respective drift region of the LDMOS transistor 100. Referring again to FIG. 3J, similarly, the asymmetric gate electrode 320 of the LDMOS transistor 300 can cause additional carriers 321 to be induced in the first semiconductor region 310. In some embodiments, such carriers 321 may be induced in a region 310' of the first semiconductor region 310. More specifically, in some embodiments, the region 310' may be disposed along portions of respective sidewalls of the second isolation region 308 that are substantially close to where the sidewalls 320C and 320D of the asymmetric gate electrode 320 start to be tilted. Based on Coulomb's Law, those additional induced carriers 321 in the region 310' may be explained by stronger electrostatic fields coupled from the asymmetric gate electrode 320 to the region 310'.

Figure 3K:
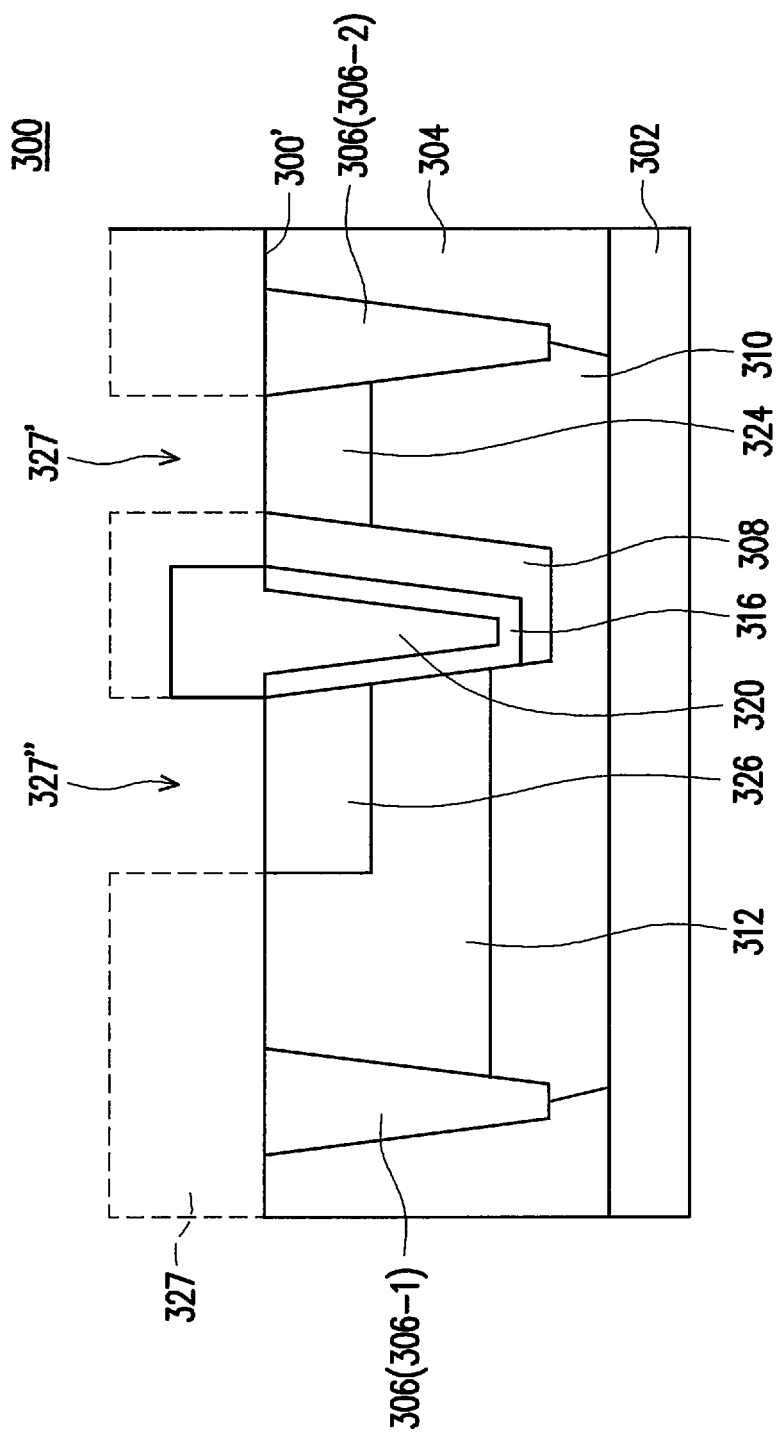

Corresponding to operation 218 of FIG. 2, FIG. 3K is a cross-sectional view of the LDMOS transistor 300 including drain contact region 324 and source contact region 326, which are formed at one of the various stages of fabrication, according to some embodiments. As shown, the drain contact region 324 is formed in the first semiconductor region 310, and more specifically, laterally disposed between the second portion 306-2 of first isolation region 306 and the first isolation region 308; and the source contact region 326 is formed in the second semiconductor region 312, and more specifically, laterally adjacent to the gate dielectric layer 316 and spaced apart from the first portion 306-1 of first isolation region 306.

In some embodiments, the drain contact region 324 is doped with the first doping type (n-type) similar to the first semiconductor region 310, but with an elevated doping concentration. Similarly, the source contact region 326 is also doped with the first doping type (n-type) similar to the first semiconductor region 310, but also with an elevated doping concentration same as, or different from, the elevated doping concentration of the drain contact region 324. In some embodiments, the drain and source contact regions 324 and 326 may be, concurrently or respectively, formed.

In an example in which the drain and source contact regions 324 and 326 are concurrently formed, the drain and source contact regions 324 and 326 may be formed by at least some of the following processes: forming a removable layer (e.g., a photoresist layer, a hardmask layer, etc.) 327 over the boundary 300' that includes a pattern 327' aligned with an area intended to form the drain contact region 324, and a pattern 327" aligned with an area intended to form the source contact region 326; performing a same doping process (e.g., an ion implantation process, a diffusion process, etc.) to incorporate a plurality of dopants with the first doping type (n-type) into first semiconductor region 310 and the second semiconductor region 312, respectively; removing the removable layer 327; and performing an optional annealing process to activate the incorporated dopants.

In another example in which the drain and source contact regions 324 and 326 are respectively formed, respective patterns aligned with areas where the drain and source contact regions 324 and 326 (e.g., 327' and 327") are intended to be formed may be sequentially provided in respective removable layers so as to allow respective doping processes to dope the first semiconductor region 310 and the second semiconductor region 312 with respective doping concentrations.

Figure 3L:
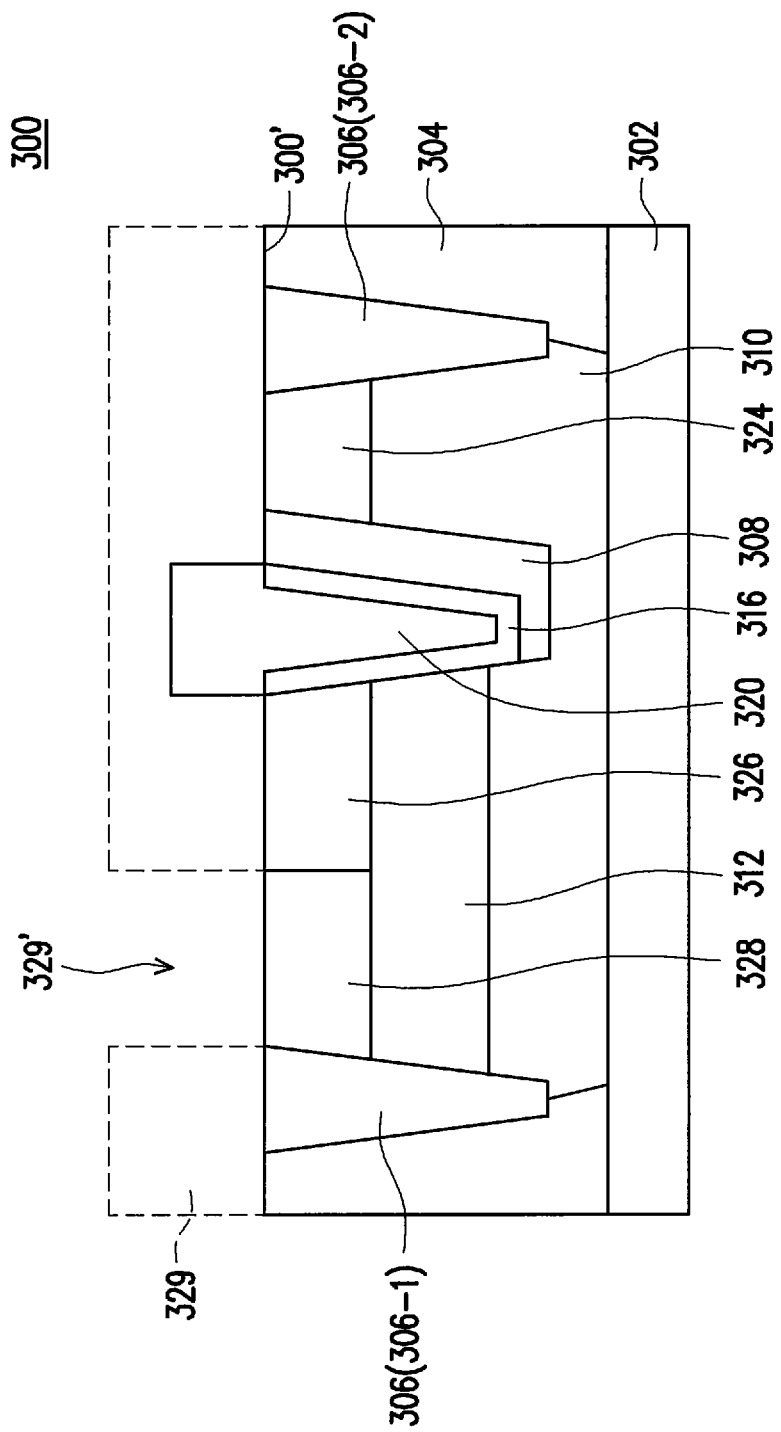

Corresponding to operation 220 of FIG. 2, FIG. 3L is a cross-sectional view of the LDMOS transistor 300 including a body contact region 328, which is formed at one of the various stages of fabrication, according to some embodiments. As shown, the body contact region 328 is formed in the second semiconductor region 312, and more specifically, laterally disposed between the second portion 306-2 of first isolation region 306 and the source contact region 328.

In some embodiments, the body contact region 328 is doped with the second doping type (p-type) similar to the second semiconductor region 312, but with an elevated doping concentration. The body contact region 328 may be formed by at least some of the following processes: forming a removable layer (e.g., a photoresist layer, a hardmask layer, etc.) 329 over the boundary 300' that includes a pattern 329' aligned with an area intended to form the body contact region 328; performing a doping process (e.g., an ion implantation process, a diffusion process, etc.) to incorporate a plurality of dopants with the second doping type (p-type) into second semiconductor region 312; removing the removable layer 329; and performing an optional annealing process to activate the incorporated dopants.

Figure 3M:
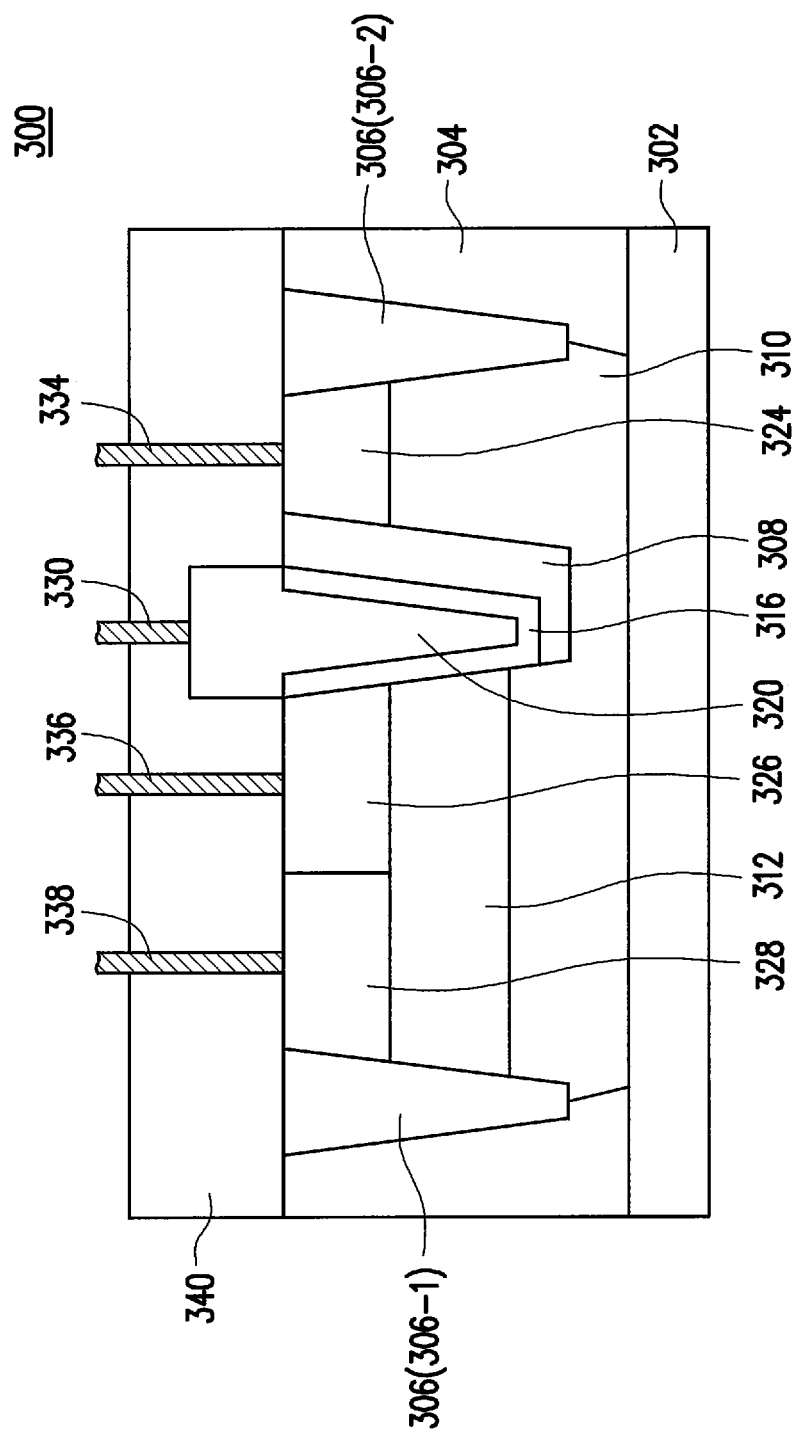

Corresponding to operation 222 of FIG. 2, FIG. 3M is a cross-sectional view of the LDMOS transistor 300 including conductive contacts 330, 334, 336, and 338 for the asymmetric gate electrode 320, the drain contact region 324, the source contact region 326, and the body contact region 328, respectively, at one of the various stages of fabrication, according to some embodiments. In some embodiments, each of the conductive contacts 330, 334, 336, and 338 is configured to electrically couple the corresponding device feature (e.g., 320, 324, 326, and 328) to one or more other device features (e.g., interconnection lines, power lines, etc.) of the LDMOS transistor 300. In some embodiments, each of the conductive contacts 330, 334, 336, and 338 extends through at least one dielectric layer 340, and is formed as a via structure including a metal material (e.g., tungsten (W)).

Although, in the above discussions, the first semiconductor region 310, the drain contact region 324, and the source contact region 326 are doped with the n-type dopants, and the second semiconductor region 312 is doped with the p-type dopants, it is understood that the polarities of dopants can be reversed (i.e., p-type to n-type, and vice versa) for a desired application. Alternatively stated, in some embodiments, the first semiconductor region 310, the drain contact region 324, and the source contact region 326 can be doped with the p-type dopants, and the second semiconductor region 312 can be doped with the n-type dopants while remaining within the scope of the present disclosure.

FIGS. 4A, 4B, 4C, and 4D respectively illustrate cross-sectional views of some alternative embodiments of the LDMOS transistor 300. Each of the alternative embodiments, illustrated in FIGS. 4A through 4D, is substantially similar to the LDMOS transistor 300 except for adding or changing one or more features to the LDMOS transistor 300. Thus, most of the reference numerals of the LDMOS transistor 300 are repeatedly used in LDMOS transistors 400, 420, 440, and 460 of FIGS. 4A, 4B, 4C, and 4D, respectively.

Figure 4A:
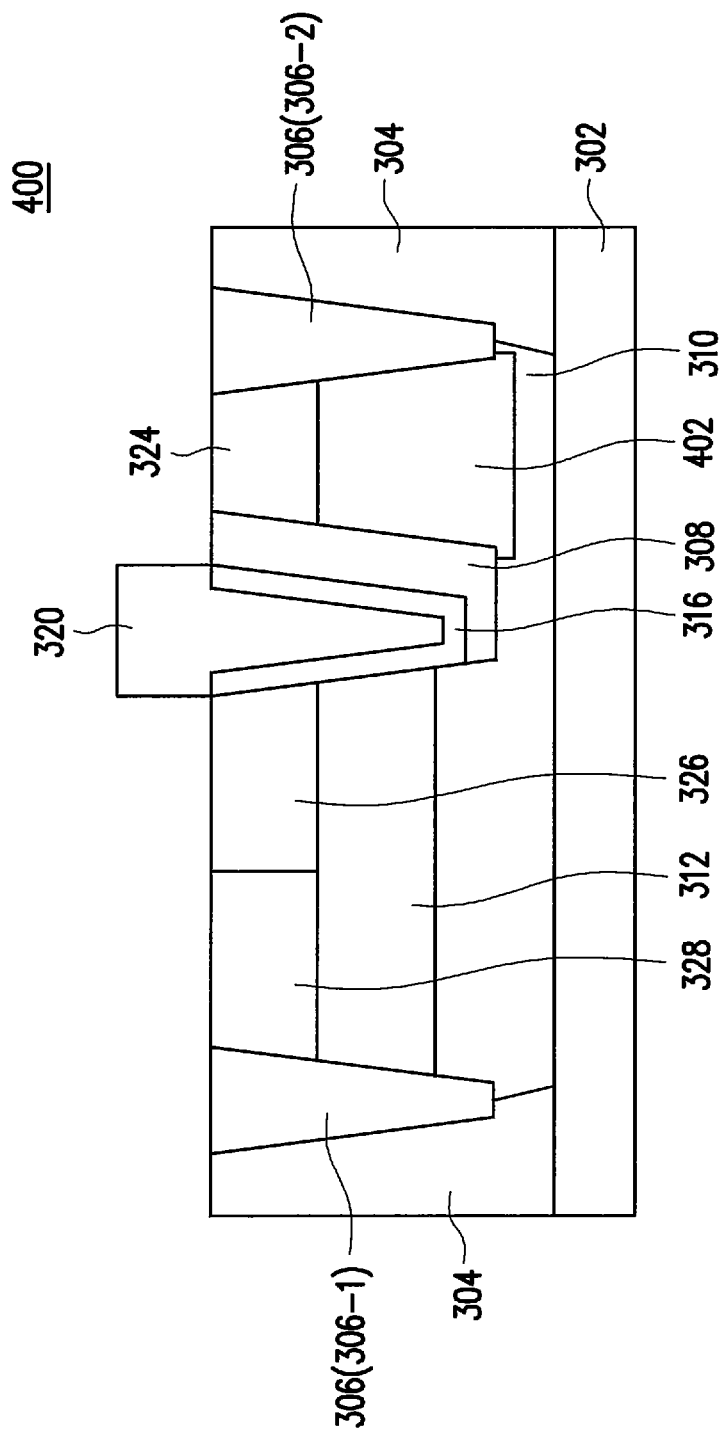
FIGS. 4A, 4B, 4C, and 4D illustrate cross-sectional views of plural alternative embodiments of the exemplary LDMOS transistor shown in FIGS. 3A-3M, in accordance with some embodiments.

FIG. 4A illustrates the LDMOS transistor 400 including an additional (e.g., third) semiconductor region 402, in accordance with some embodiments. The third semiconductor region 402 with the first doping type (n-type) is arranged over the first semiconductor region 310, laterally spaced from the second semiconductor region 312 by the second isolation region 308. The third semiconductor region 402 has a lower boundary that is vertically spaced above the lower boundary of the first semiconductor region 310 (e.g., the lower boundary 304A of the epitaxial layer 304 in the current example). Further, the third semiconductor region 402 underlies the drain contact region 324 and, in some embodiments, has a doping concentration that is respectively higher and lower compared to the first semiconductor region 310 and the drain contact region 324.

Figure 4B:
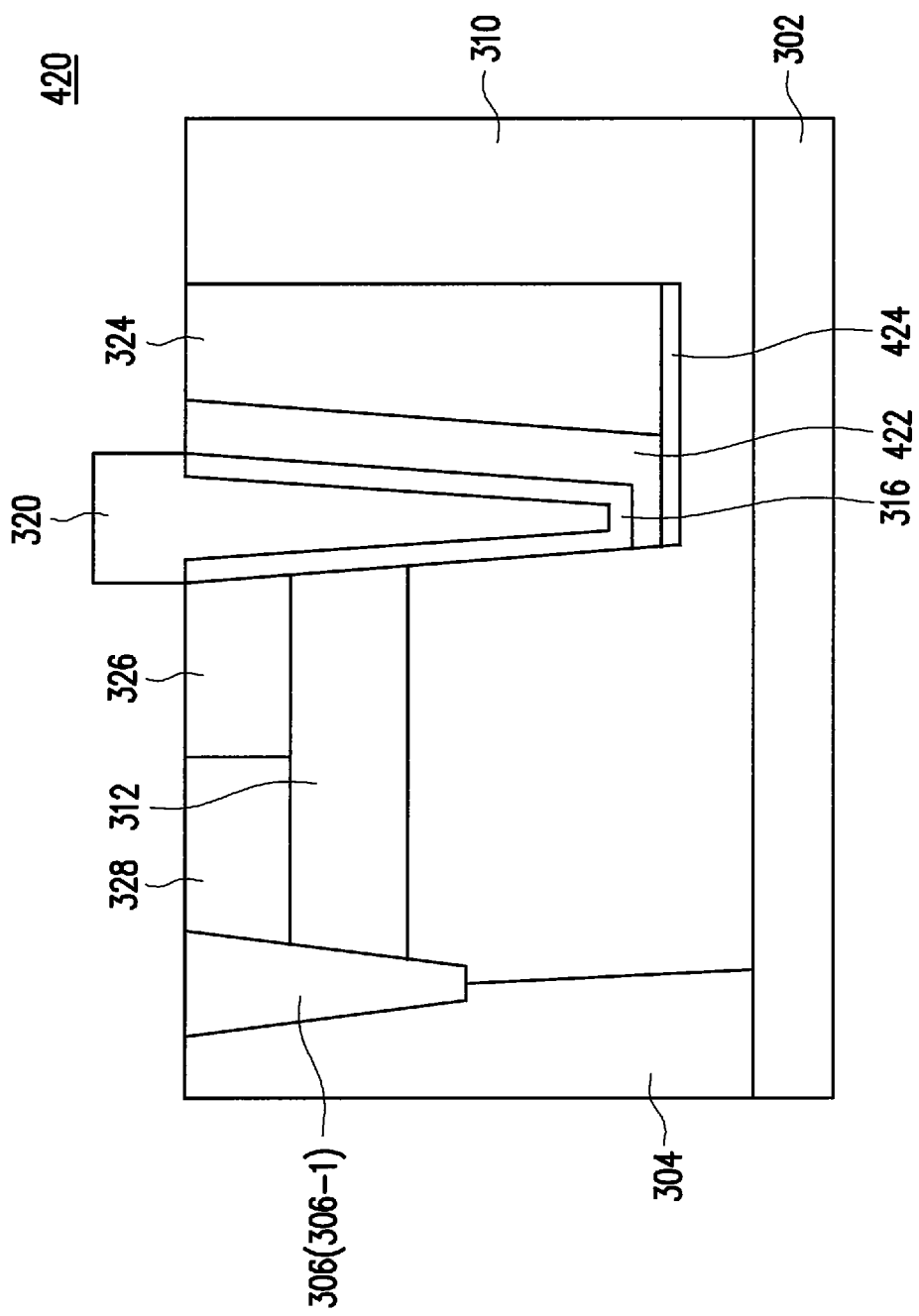
Figure 4C:
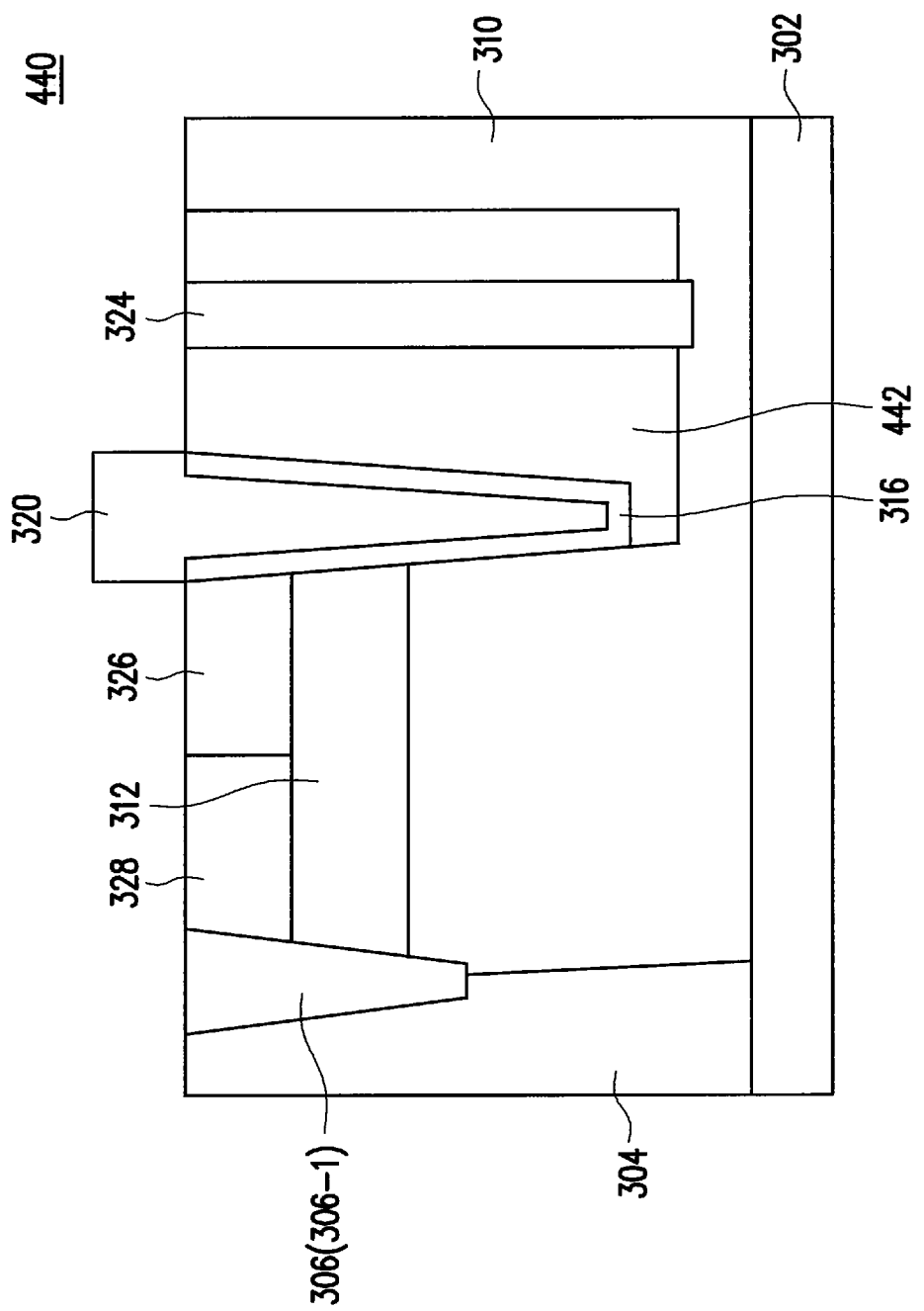
Figure 4D:
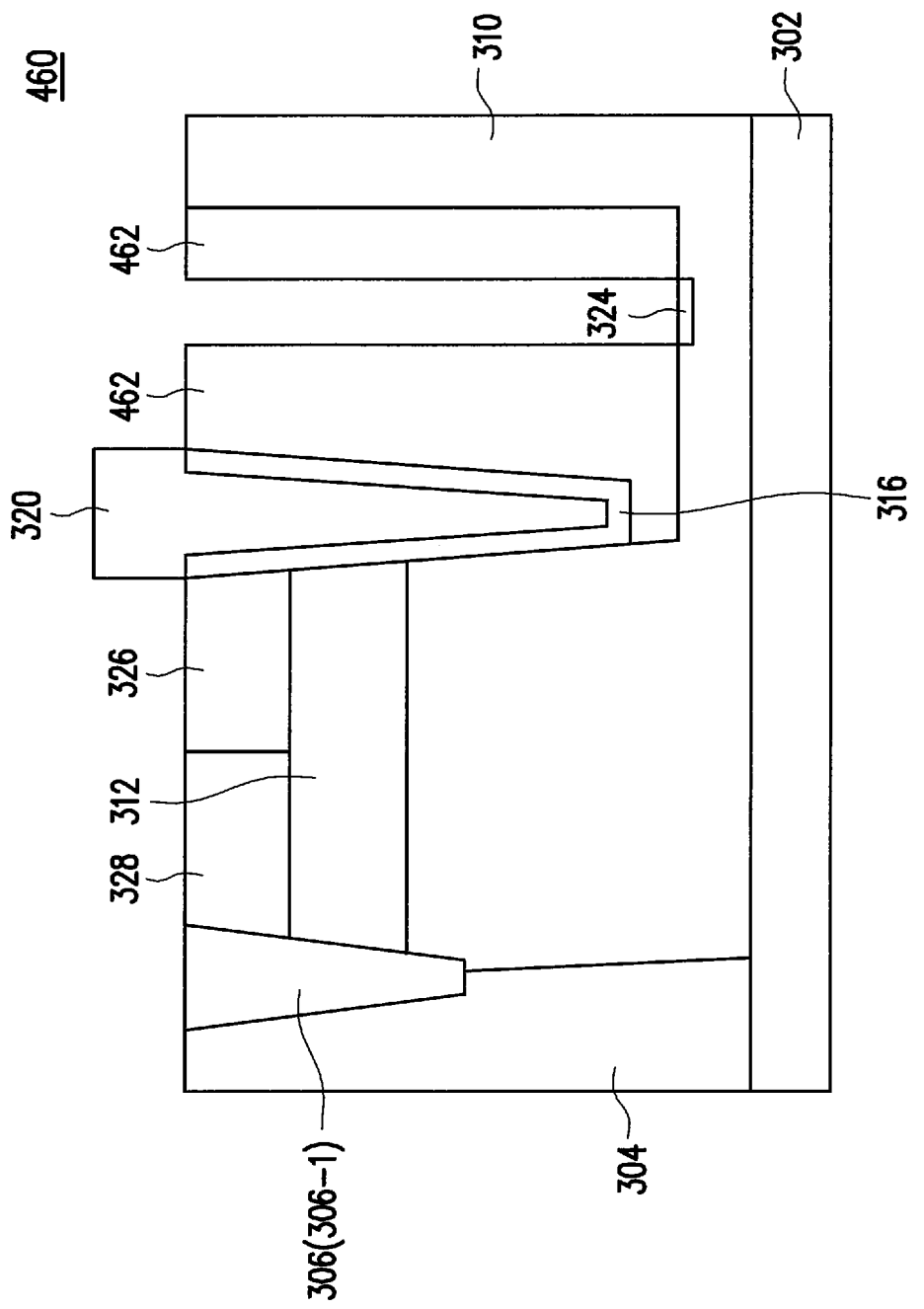

As mentioned above, at least one of the first and second isolation regions 306 and 308 may be implemented as a DTI (deep trench isolation) feature. FIGS. 4B-4D each illustrates an example when the second isolation region 308 is implemented as a DTI feature. It is noted that for purposes of brevity, only the first portion 306-1 of the first isolation region 306 is shown in FIGS. 4B-4D.

Referring first to FIG. 4B, the LDMOS transistor 420 includes a DTI feature 422, in accordance with some embodiments. As implied by the name, the DTI feature has a greater depth than the STI feature. As shown in the illustrated embodiment of FIG. 4B where the first isolation region 306 (306-1) is implemented as the STI feature, the DTI feature 422 extends into the first semiconductor region 310 by a greater depth. Similar to the formations of the gate dielectric layer 316 and the asymmetric gate electrode 320 in the second isolation region 308 (FIGS. 3H and 3I), the gate dielectric layer 316 and the asymmetric gate electrode 320 is accordingly formed in such a DTI feature 422, followed by the formation of the drain contact region 324. In the illustrated embodiment of FIG. 4B, prior to forming the DTI feature 422 in the first semiconductor region 310, a fourth semiconductor region 424 with the first doping type (n-type) is formed in the first semiconductor region 310. As such, the DTI feature 422 is vertically spaced from the first semiconductor region 310 by the fourth semiconductor region 424. The fourth semiconductor region 424 may be doped in a doping concentration different from the first semiconductor region 310 and the drain contact region 324.

Referring to FIG. 4C, the LDMOS transistor 440 includes a DTI feature 442, in accordance with some embodiments. The LDMOS transistor 440 is substantially similar to the LDMOS transistor 420 (FIG. 4B) except that the DTI feature 442 of the LDMOS transistor 440 extends into the first semiconductor region 310 without an additional semiconductor region (e.g., 424) vertically coupled therebetween. In such an embodiment, the drain contact region 324 may extend through the DTI feature 442 and contact the first semiconductor region 310. Alternatively stated, in the LDMOS transistor 440, the drain contact region 324 has a lower boundary that is vertically below a lower boundary of the DTI feature 442.

In some embodiments, the drain contact region 324 of the LDMOS transistor 440 may be formed subsequent to the formation of the DTI feature 442. For example, after the formation of the DTI feature 442, one or more dry/wet etching processes are performed to recess through the DTI feature 442 to form a trench extending to the first semiconductor region 310. Then, an epitaxial process is performed to grow an un-doped semiconductor region from the first semiconductor region 310 and through the DTI feature 442. At least one of doping processes are performed to dope the un-doped semiconductor region with the n-type dopants so as to form the drain contact region 324.

Referring to FIG. 4D, the LDMOS transistor 460 includes a DTI feature 462, in accordance with some embodiments. The LDMOS transistor 460 is substantially similar to the LDMOS transistor 440 (FIG. 4C) except that the drain contact region 324 of the LDMOS transistor 460 does not extend through the DTI feature 462. The drain contact region 324 of the LDMOS transistor 460 is formed in the first semiconductor region 310 and below a lower boundary of the DTI feature 462. More specifically, in the LDMOS transistor 460, the drain contact region 324 has an upper boundary aligned with the lower boundary of the DTI feature 462.

In some embodiments, the drain contact region 324 of the LDMOS transistor 460 may be formed subsequent to the formation of the DTI feature 462. For example, after the formation of the DTI feature 462, one or more dry/wet etching processes are performed to recess through the DTI feature 462 to form a trench extending to the first semiconductor region 310. Then, at least one of doping processes are performed to dope the first semiconductor region 310 with the n-type dopants so as to form the drain contact region 324.

Figure 5:
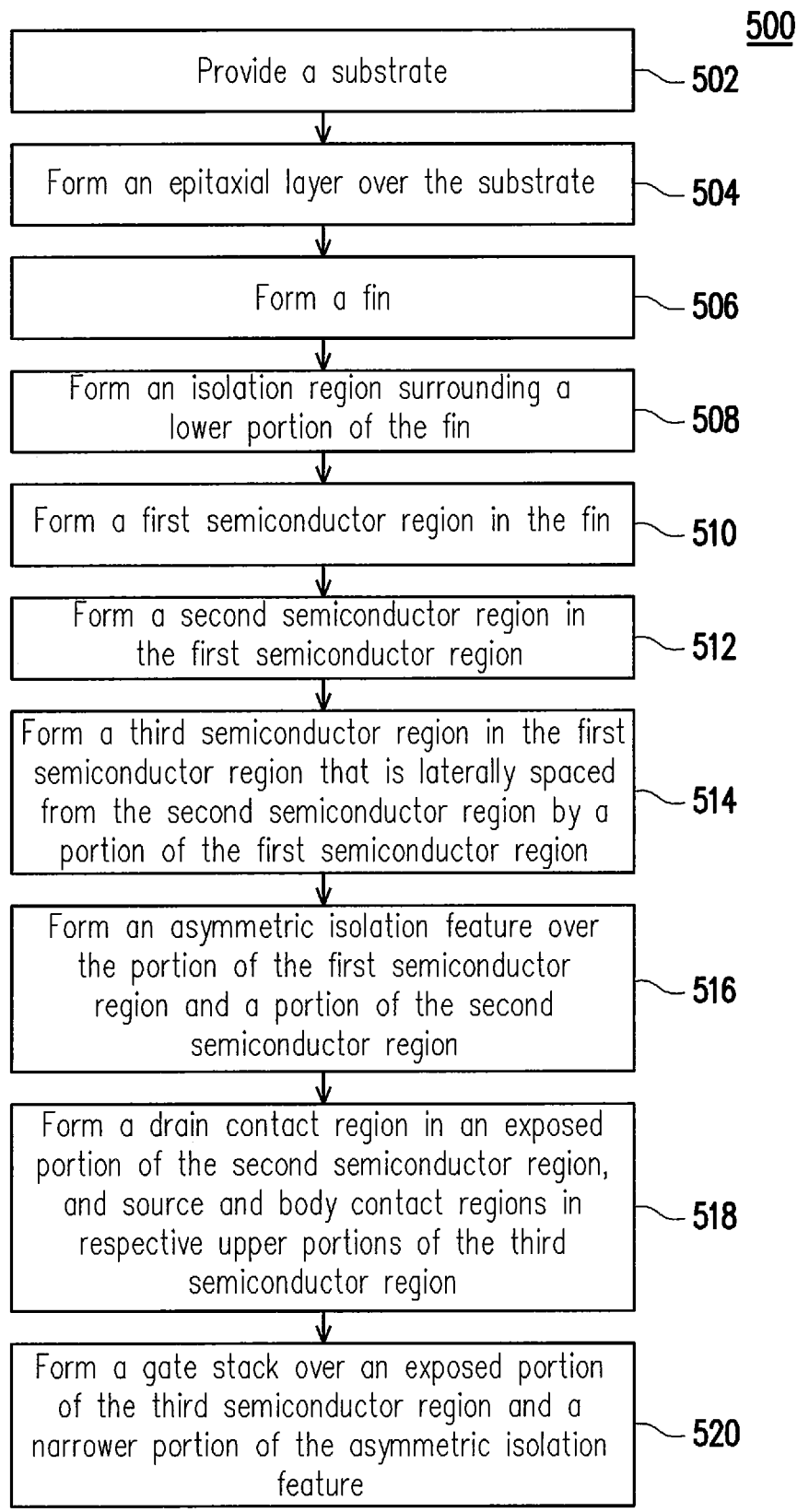
FIG. 5 illustrates a flow chart of a method to form an LDMOS fin field-effect transistor (FinFET), in accordance with some embodiments, in accordance with some embodiments.

FIG. 5 illustrates a flowchart of an exemplary method 500 to form a semiconductor device according to one or more embodiments of the present disclosure. It is noted that the method 500 is merely an example, and is not intended to limit the present disclosure. In some embodiments, the semiconductor device made by the method 500 is an LDMOS transistor with an asymmetric gate electrode that is substantially similar to the LDMOS transistor 300 discussed FIGS. 3A-3M except that the method 500 is directed to make an LDMOS fin field-effect-transistor (FinFET). As employed in the present disclosure, the FinFET refers to any fin-based, multi-gate transistor. It is noted that the method of FIG. 5 does not produce a completed LDMOS FinFET. A completed LDMOS FinFET may be fabricated using complementary metal-oxide-semiconductor (CMOS) technology processing. Accordingly, it is understood that additional operations may be provided before, during, and after the method 500 of FIG. 5, and that some other operations may only be briefly described herein.

In some embodiments, the method 500 starts with operation 502 in which a substrate is provided. The method 500 continues to operation 504 in which an epitaxial layer is formed over the substrate. The method 500 continues to operation 506 in which a fin is formed. In some embodiments, the fin extends beyond a major surface of the epitaxial layer. The method 500 continues to operation 508 in which an isolation region is formed surrounding a lower portion of the fin. The method 500 continues to operation 510 in which a first semiconductor region is formed in the fin. In some embodiments, the first semiconductor region is doped with a first doping type (e.g., n-type). The method 500 continues to operation 512 in which a second semiconductor region is formed in the first semiconductor region. In some embodiments, the second semiconductor region is doped with the first doping type (n-type) but with an elevated doping concentration when compared to the first semiconductor region. The method 500 continues to operation 514 in which a third semiconductor region is formed in the first semiconductor region. In some embodiments, the third semiconductor region is laterally spaced from the second semiconductor region by a portion of the first semiconductor region. In some embodiments, the third semiconductor region is doped with a second doping type, different from the first doping type, (e.g., p-type).

Next, the method 500 continues to operation 516 in which an asymmetric isolation feature is formed over the fin. In some embodiments, the asymmetric isolation feature straddles (i.e., overlaying respective top surface and sidewalls) a portion of the second semiconductor region and the portion of the first semiconductor region that is laterally between the second and third semiconductor regions. In some embodiments, such an asymmetric isolation feature includes: a first sidewall relatively closer to the third semiconductor region; a second sidewall relatively closer to the second semiconductor region; and third and fourth sidewalls respectively coupled between the first and second sidewalls. In some embodiments, the second sidewall has a cross-sectional area that is substantially greater than a cross-sectional area of the first sidewall, which causes the third and fourth sidewalls to be tilted toward each other at respective ends closer to the first sidewall.

Next, the method 500 continues to operation 518 in which drain, source, and body contact regions are formed. In some embodiments, the drain contact region is formed in an upper portion of the second semiconductor region that is not overlaid by the asymmetric isolation feature; the source contact region is formed in an upper portion of the third semiconductor region that is not overlaid by the asymmetric isolation feature; and the body contact region is formed in another upper portion of the third semiconductor region that is not overlaid by the asymmetric isolation feature. In some embodiments, the body contact region may laterally contact the source contact region. The method 500 continues to operation 520 in which a gate stack is formed over the fin and a portion of the asymmetric isolation feature. In some embodiments, the gate stack includes a gate dielectric layer and a gate electrode overlaying the gate dielectric layer. In some embodiments, the gate dielectric layer straddles the portion of the third semiconductor region that is laterally between the source contact region and the asymmetric isolation feature; and the gate electrode straddles the gate dielectric layer and further straddles a narrower portion of the asymmetric isolation feature (e.g., overlaying the first sidewall and portions of the third and fourth sidewalls).

In some embodiments, operations of the method 500 may be associated with perspective views of a semiconductor device 600 at various fabrication stages as shown in FIGS. 6A, 6B, 6C, 6E, 6G, 6I, 6K, 6M, 6P, and 6R, respectively.

Figure 6A:
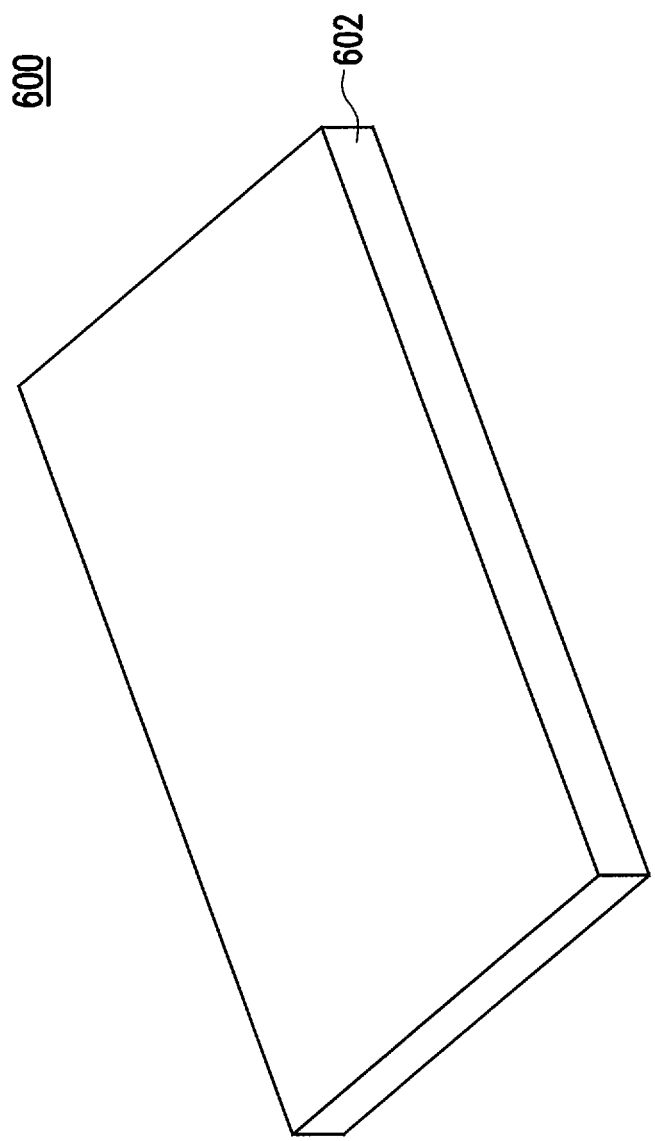
FIGS. 6A, 6B, 6C, 6E, 6G, 6I, 6K, 6M, 6P, and 6R illustrate perspective views of an exemplary LDMOS FinFET, made by the method of FIG. 5, during various fabrication stages, in accordance with some embodiments.
Figure 6B:
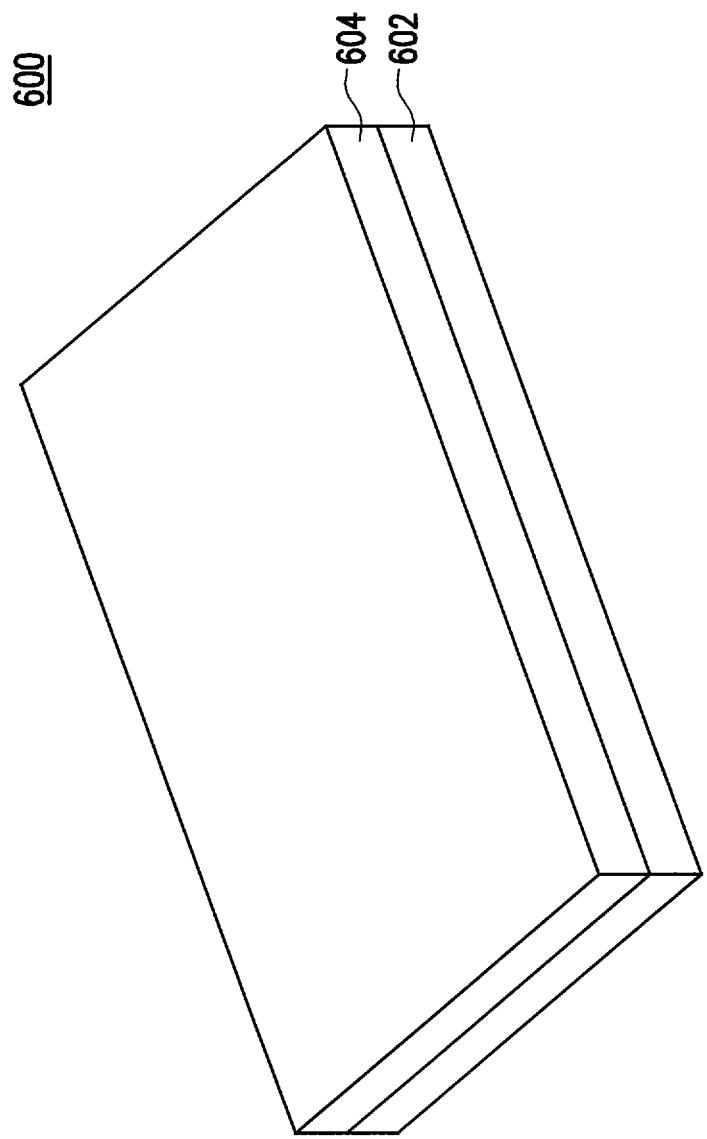
Figure 6C:
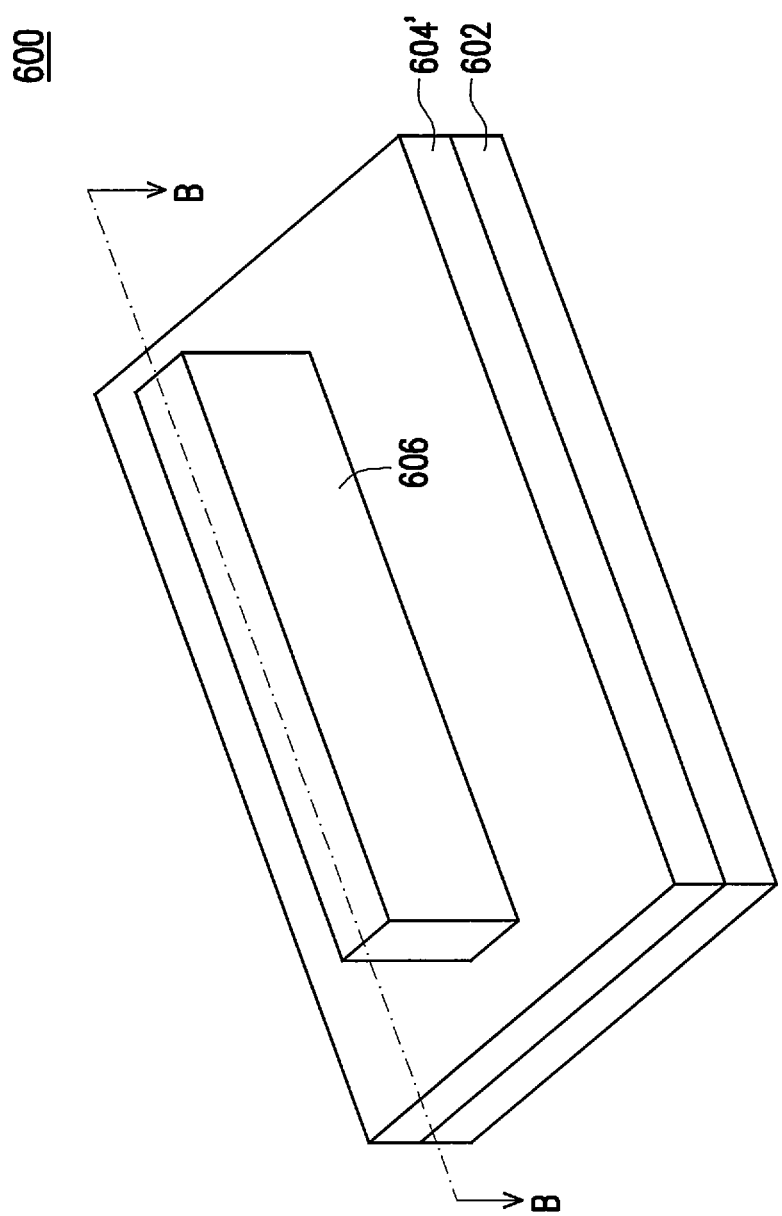
Figure 6D:
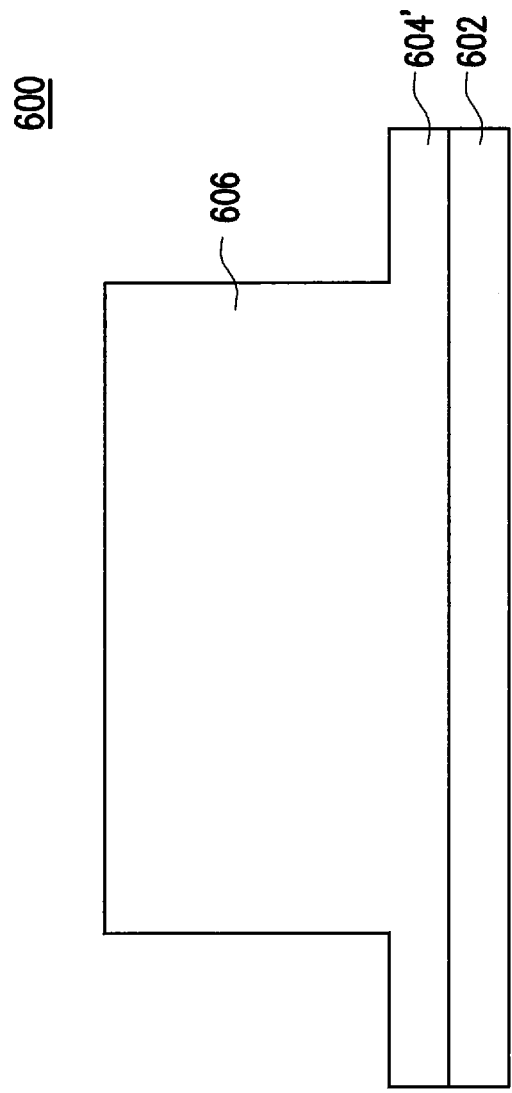
FIGS. 6D, 6F, 6H, 6J, 6L, 6N, 6Q, and 6S respectively illustrate corresponding cross-sectional views of the exemplary LDMOS FinFET of FIGS. 6C, 6E, 6G, 6I, 6K, 6M, 6P, and 6R, in accordance with some embodiments.
Figure 6E:
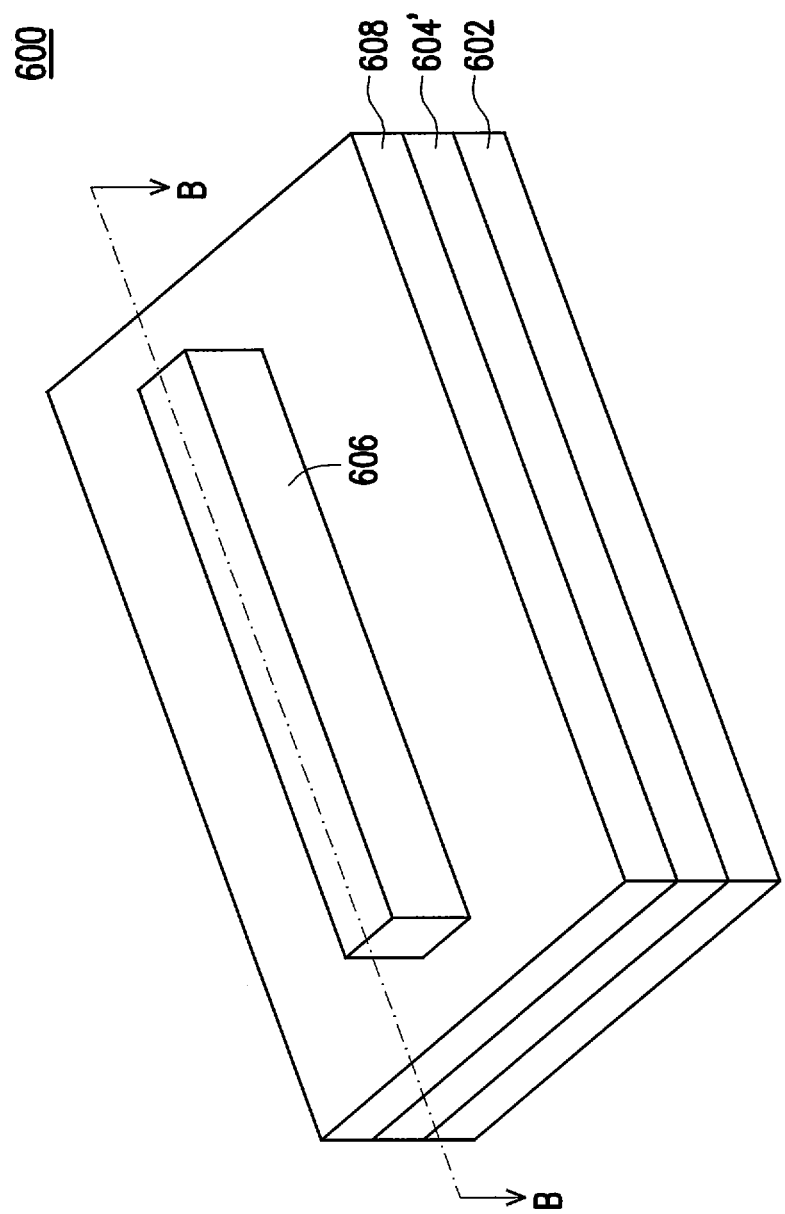
Figure 6F:
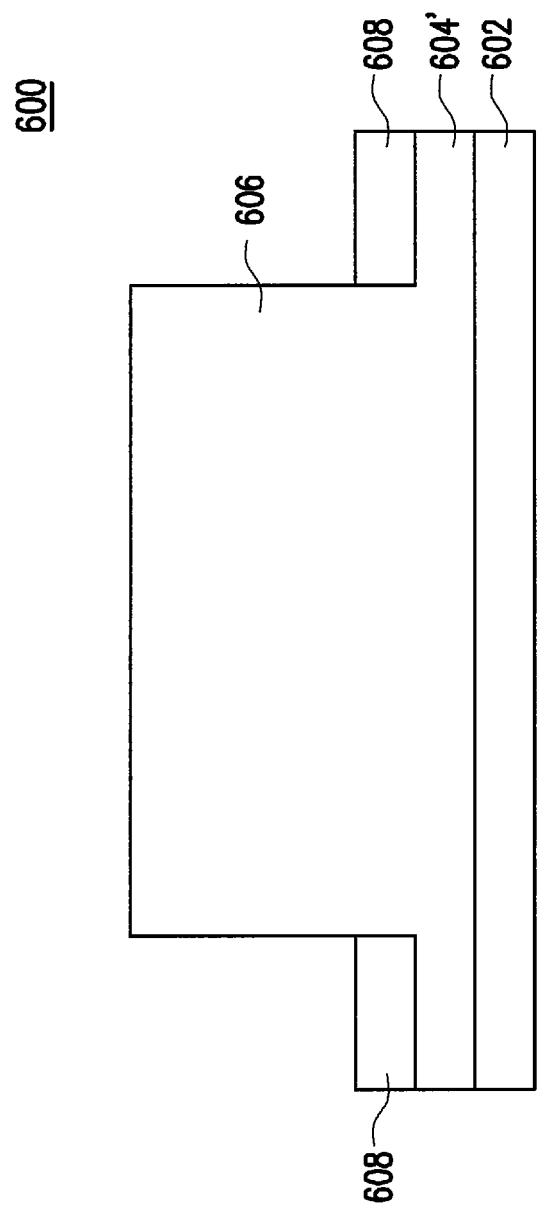
Figure 6G:
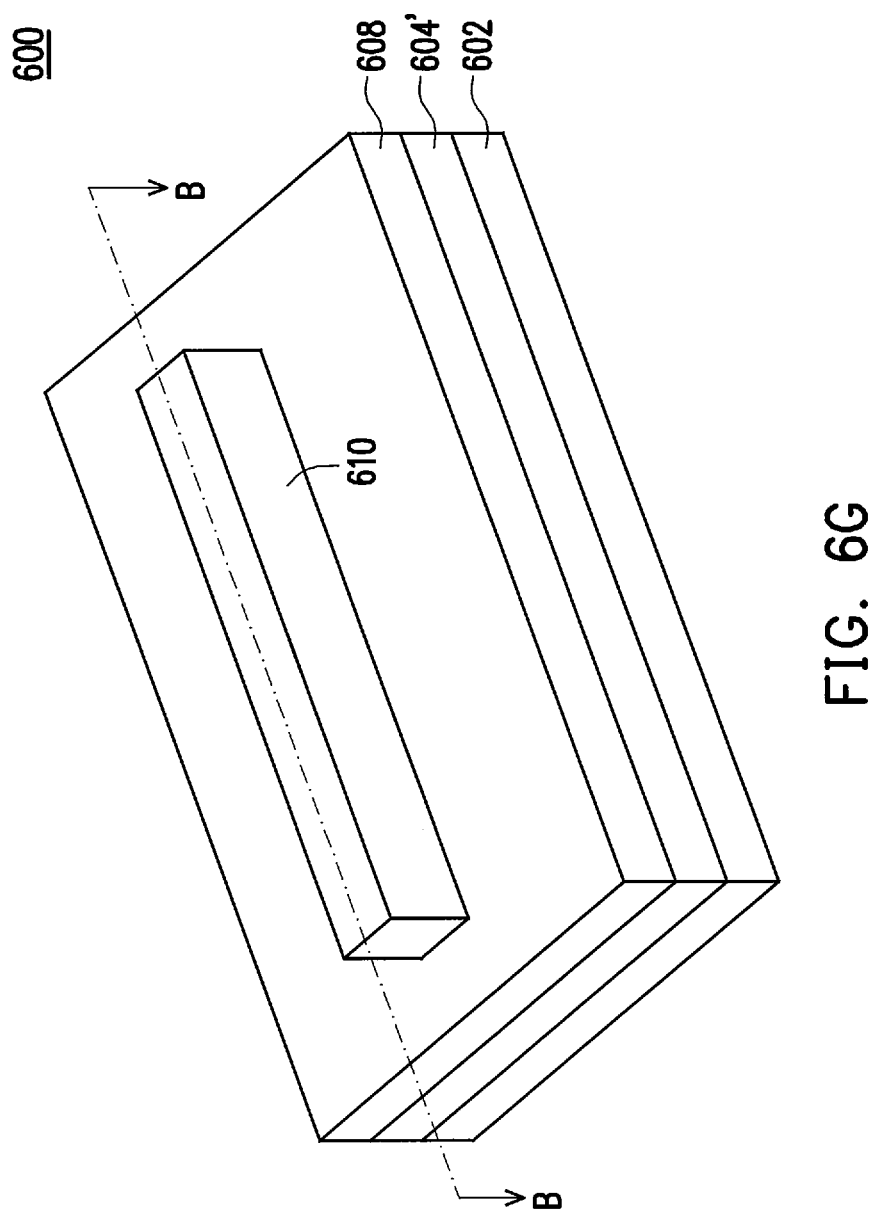
Figure 6H:
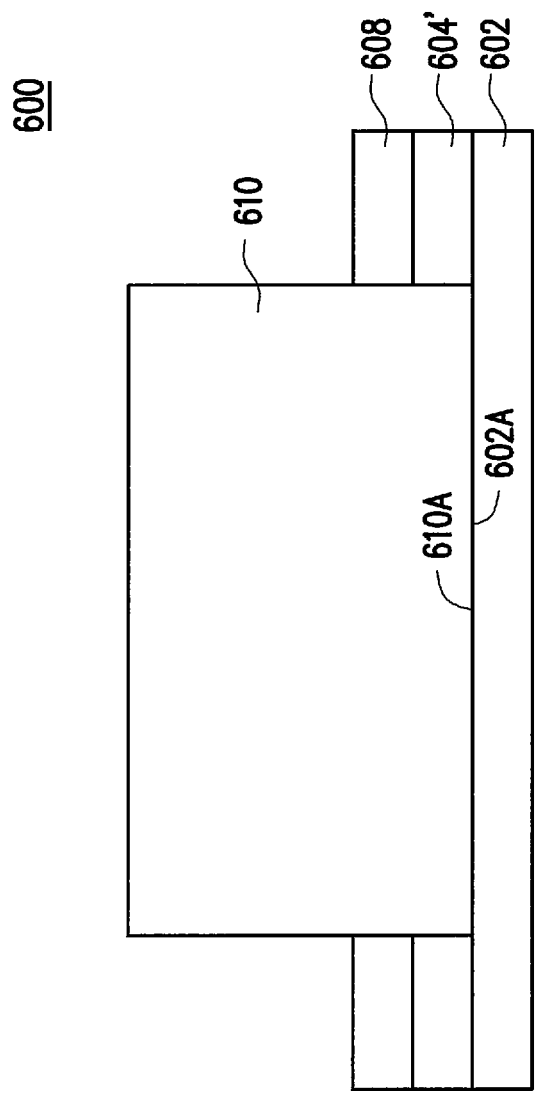
Figure 6I:
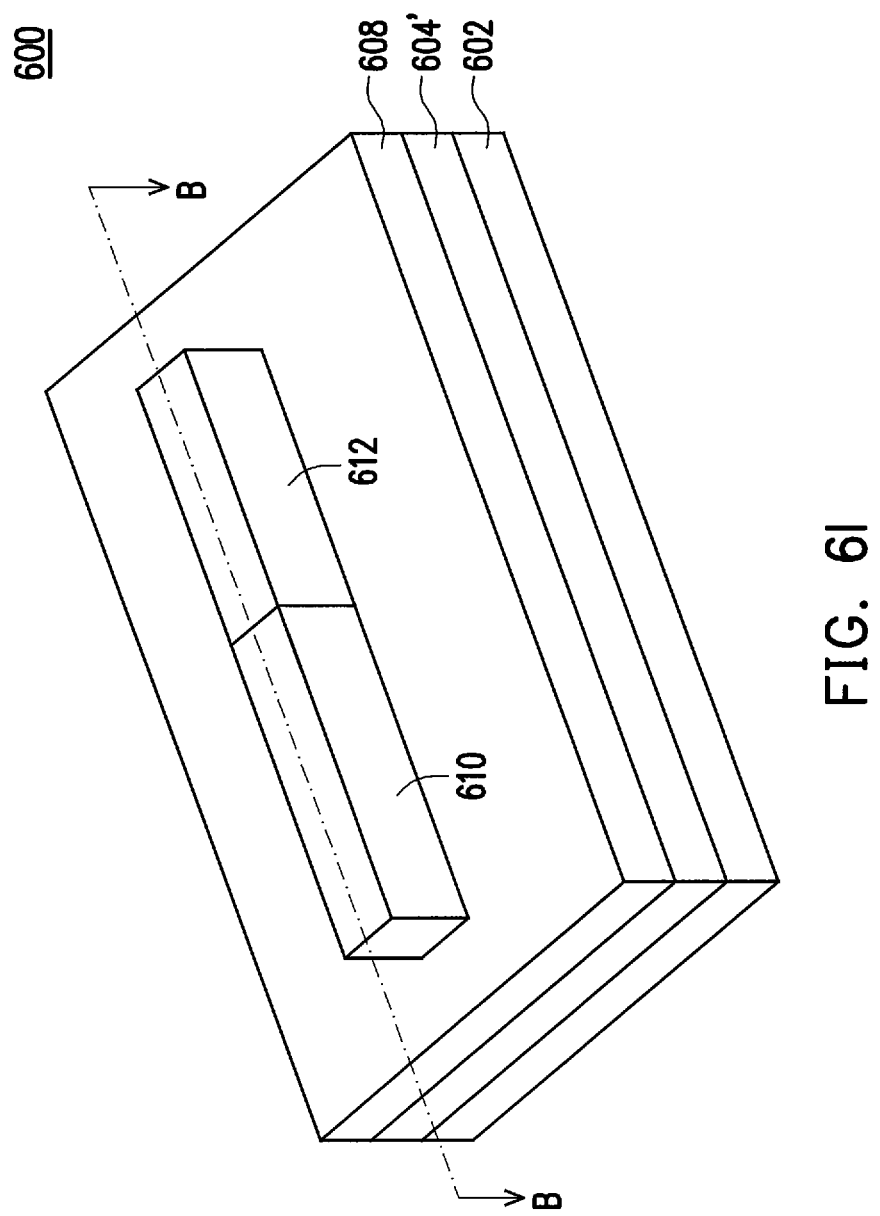
Figure 6J:
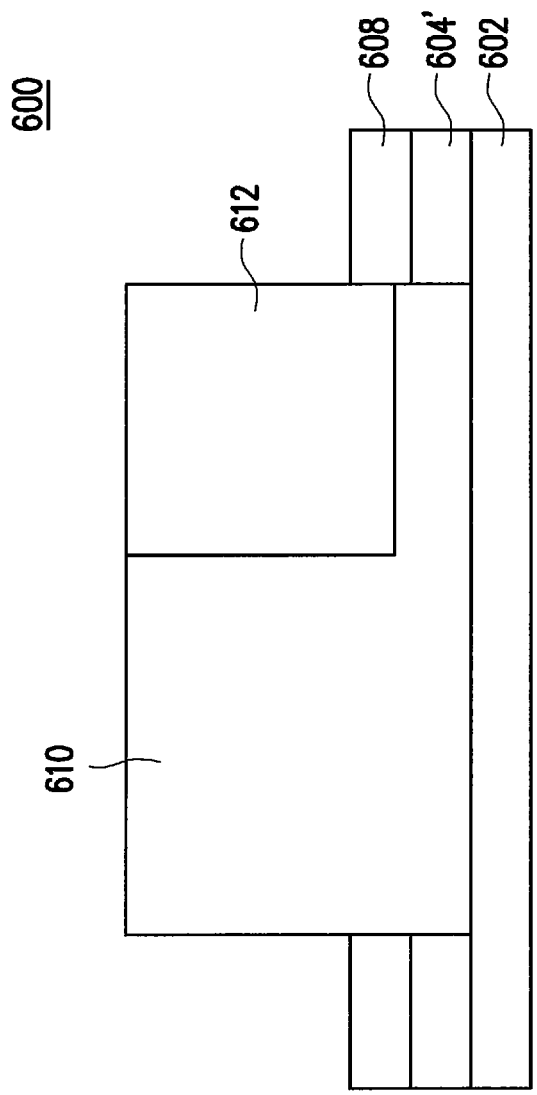
Figure 6K:
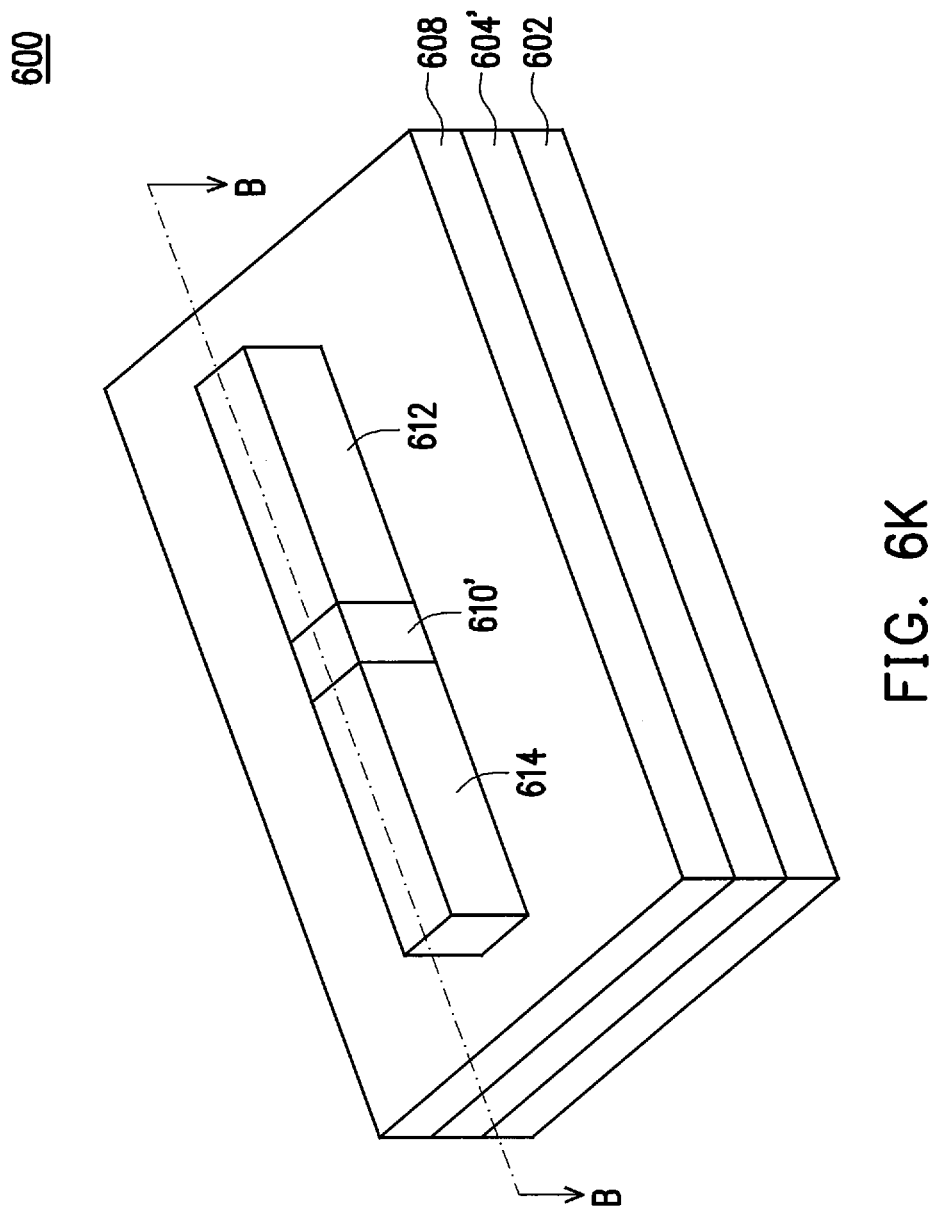
Figure 6L:
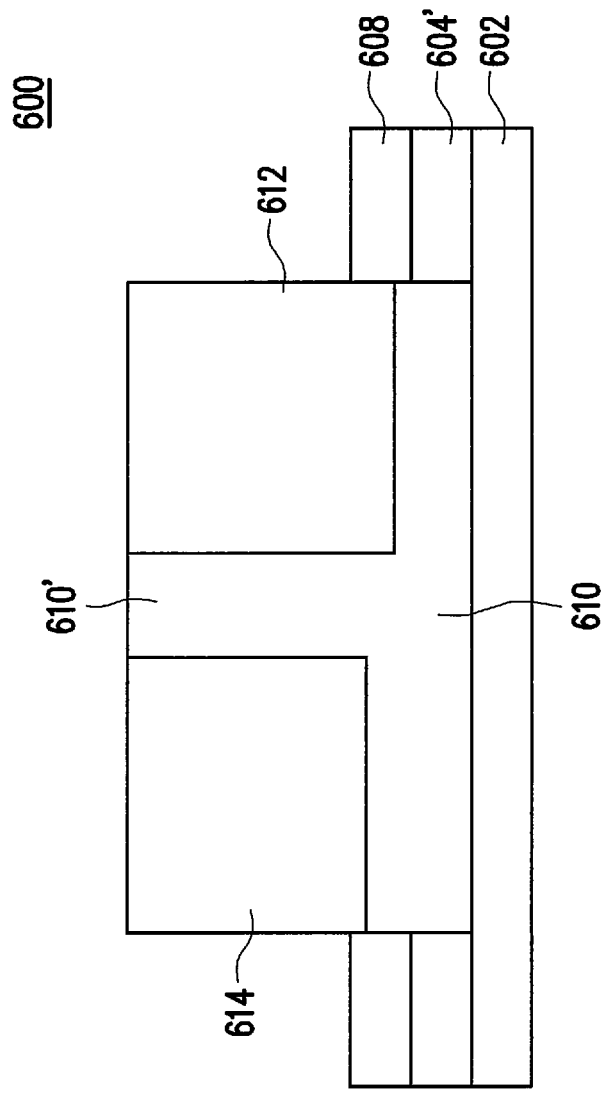
Figure 6M:
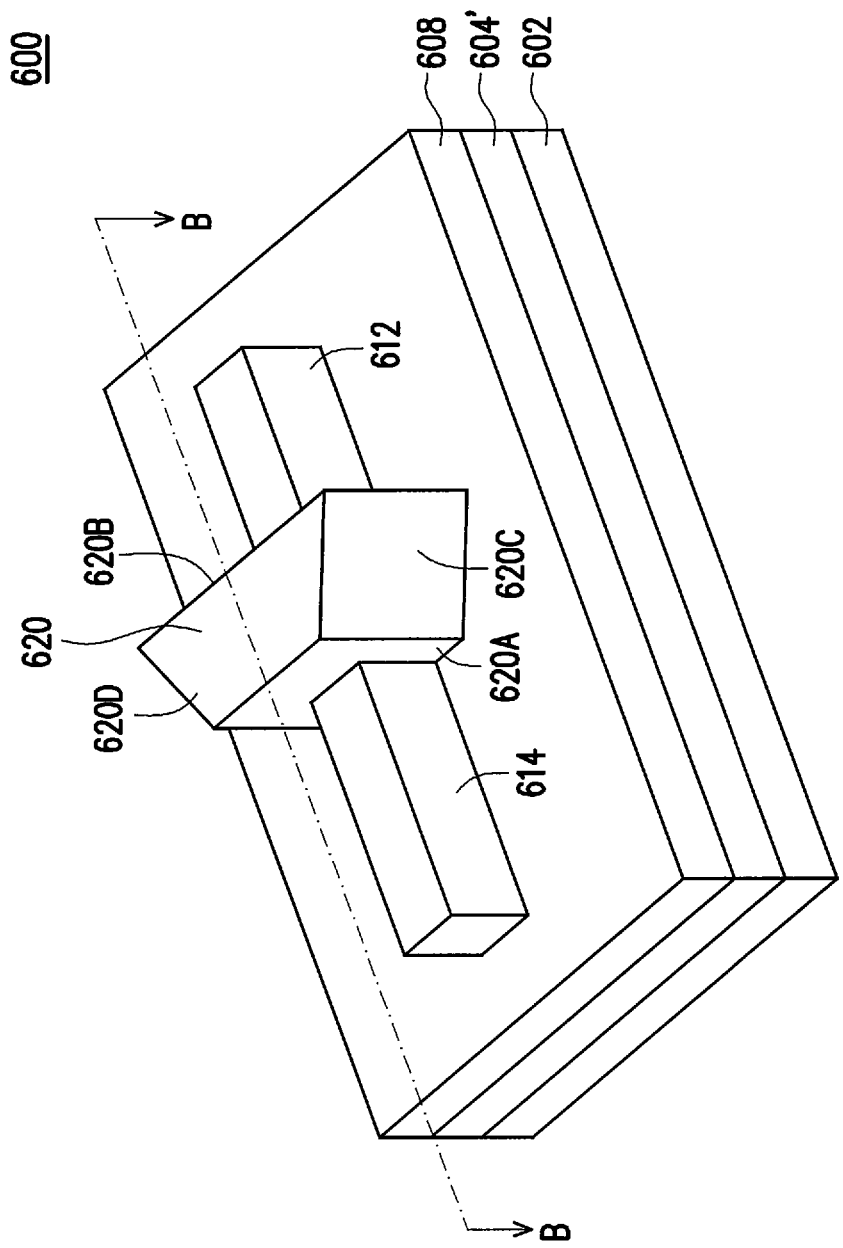
Figure 6N:
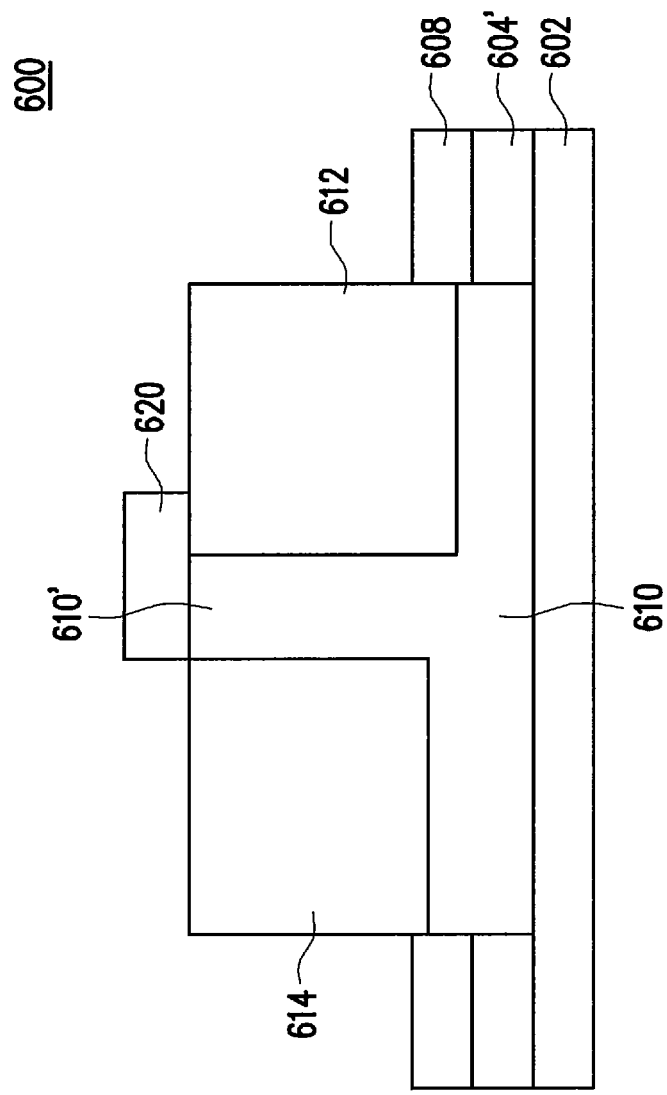
Figure 60:
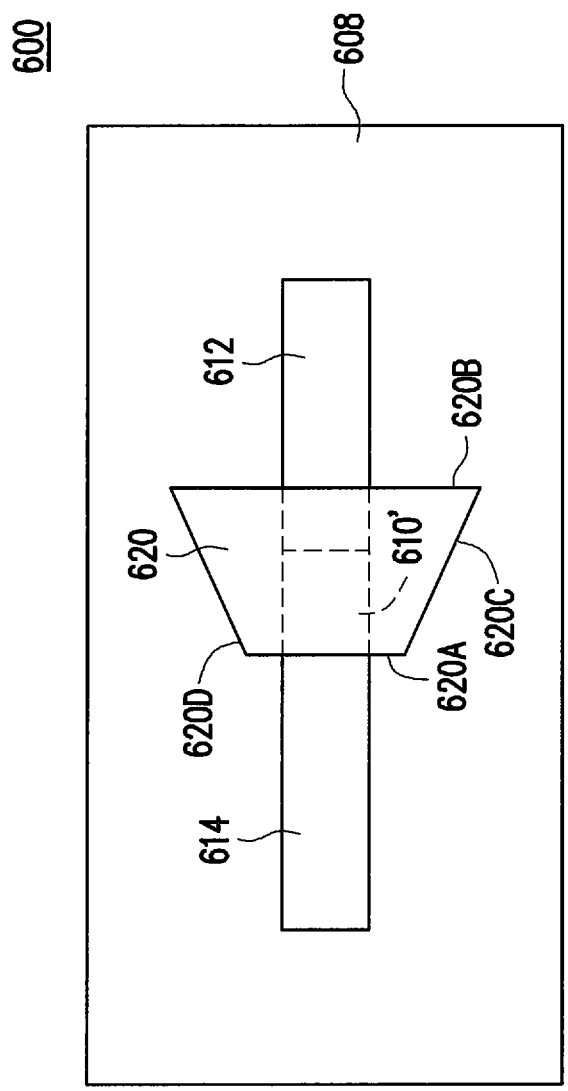
Figure 6P:
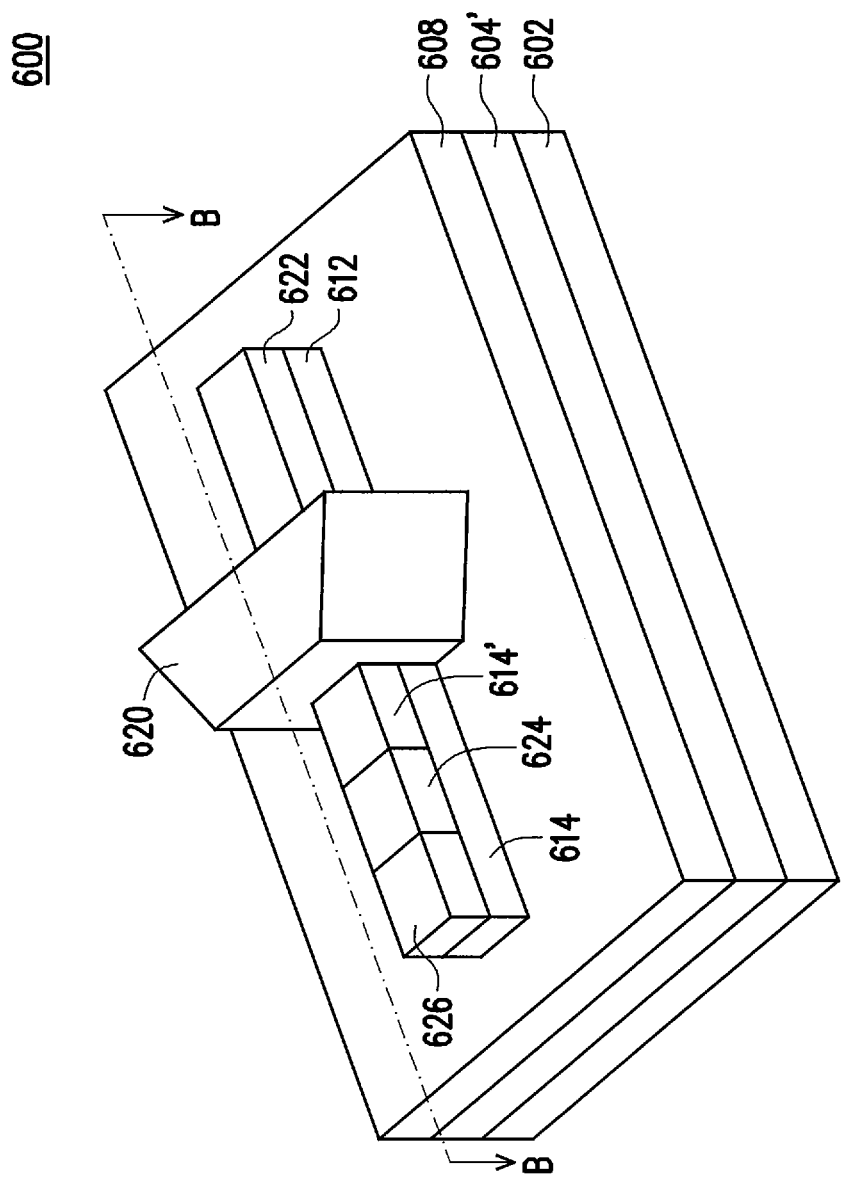
Figure 6Q:
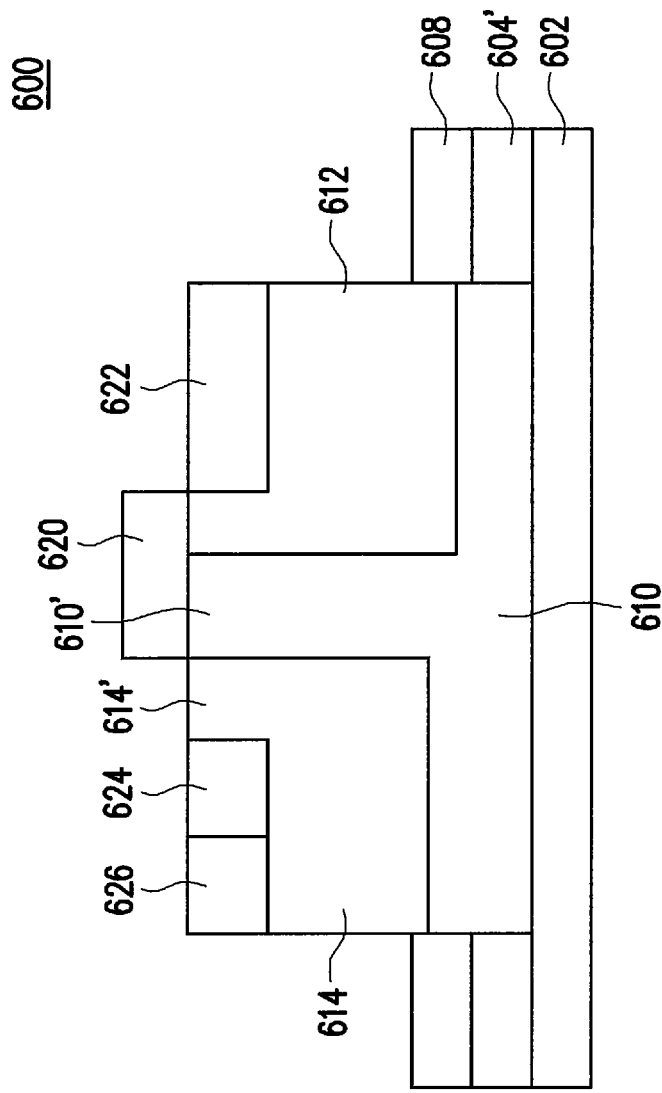
Figure 6R:
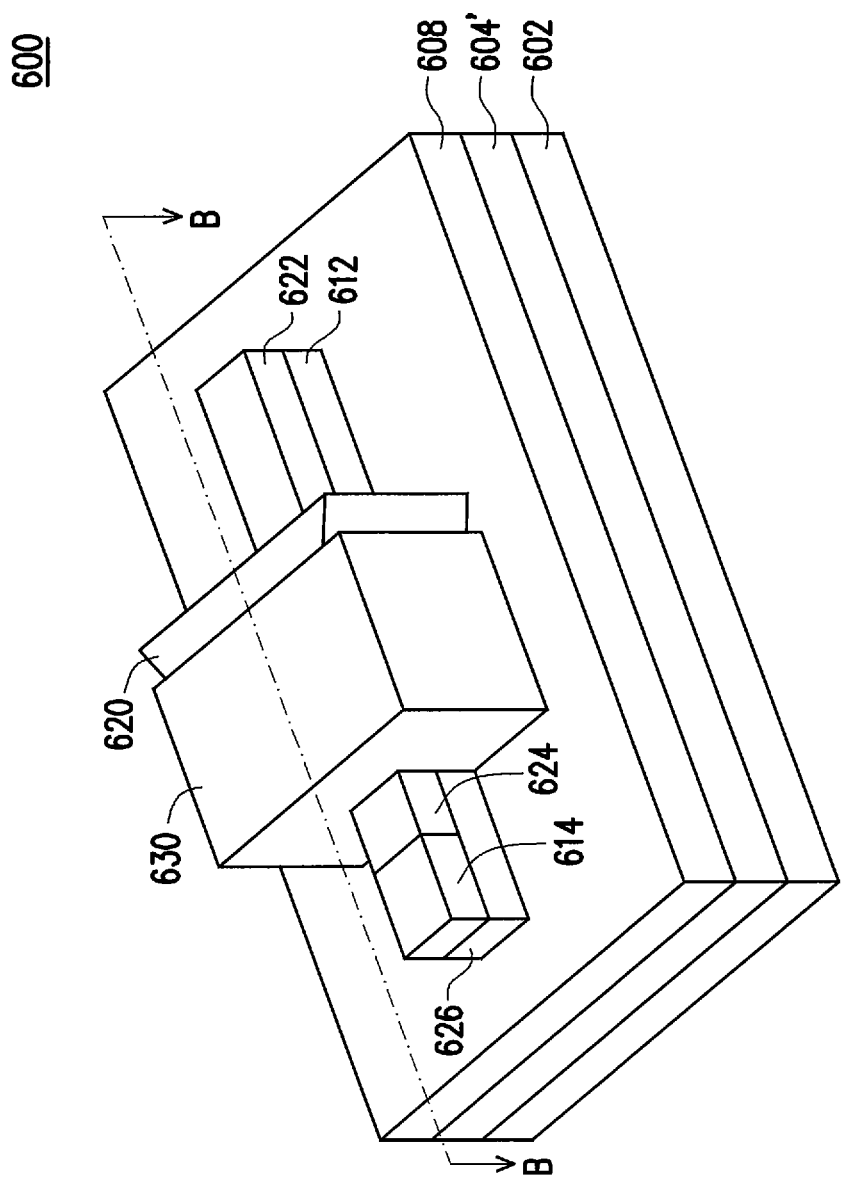
Figure 6S:
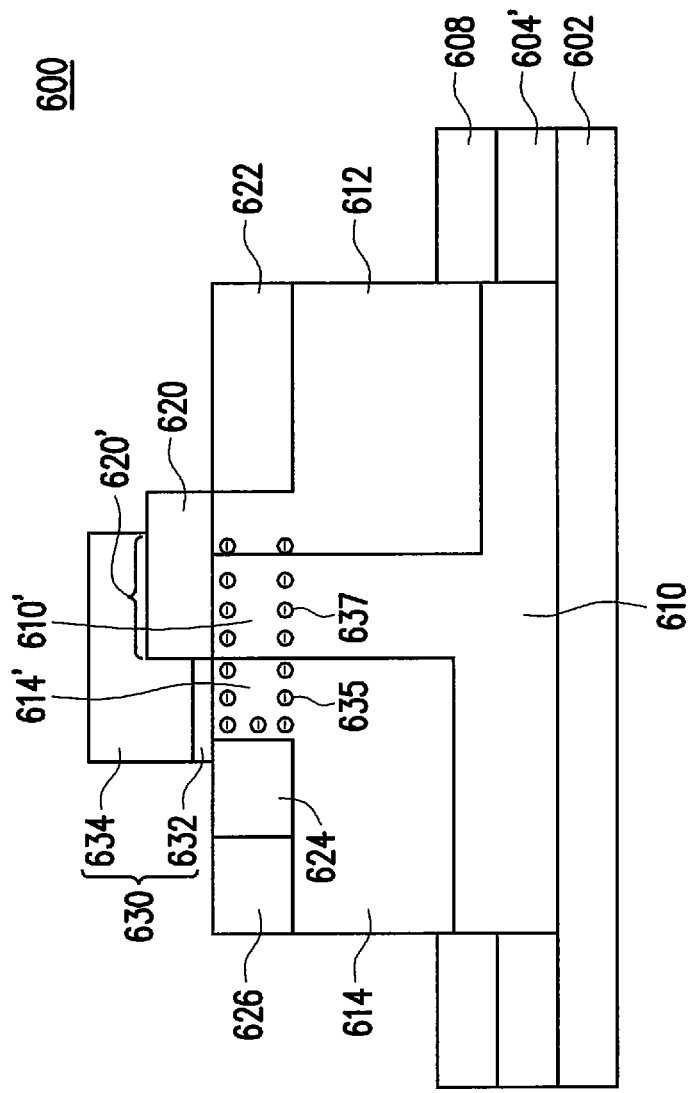
Figure 6T:
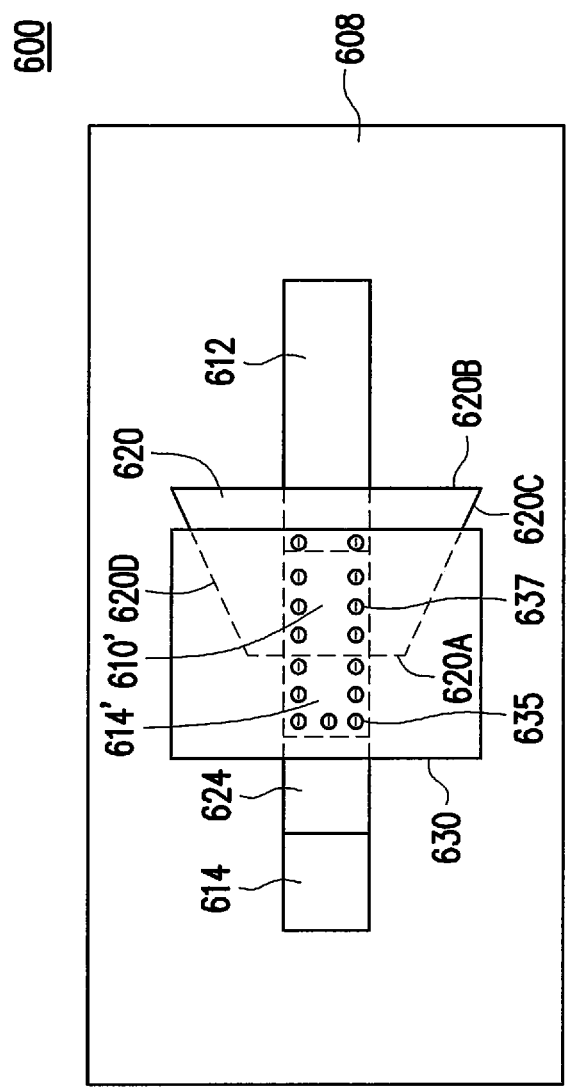

For purpose of clarity of illustration, cross-sectional views corresponding to the perspective view of FIGS. 6C, 6E, 6G, 6I, 6K, 6M, and 6P are illustrated in FIGS. 6D, 6F, 6H, 6J, 6L, 6N, and 6Q, respectively, and top views corresponding to the perspective view of FIGS. 6M and 6R are illustrated in FIGS. 6O and 6T, respectively.

As mentioned above, the semiconductor device 600 may be an LDMOS FinFET. The LDMOS FinFET 600 may be included in a circuit such as, for example, a microprocessor, a memory cell, and/or an integrated circuit (IC). Also, FIGS. 6A through 6T are simplified for a better understanding of the concepts of the present disclosure. For example, although the figures illustrate the LDMOS FinFET 600, it is understood the, circuit containing the LDMOS FinFET 600 may comprise a number of other devices comprising resistors, capacitors, inductors, fuses, etc., which are not shown in FIGS. 6A through 6T, for purposes of clarity of illustration.

Corresponding to operation 502 of FIG. 5, FIG. 6A is a perspective view of the LDMOS FinFET 600 including a substrate 602 at one of the various stages of fabrication, according to some embodiments. Such a substrate 602 is substantially similar to the substrate 302 (FIG. 3A) so that discussion of the substrate 602 is not repeated here. Corresponding to operation 504 of FIG. 5, FIG. 6B is a perspective view of the LDMOS FinFET 600 including an epitaxial layer 604, which is formed over the substrate 602 at one of the various stages of fabrication, according to some embodiments. Such a epitaxial layer 604 is also substantially similar to the epitaxial layer 304 (FIG. 3B) so that discussion of the epitaxial layer 604 is not repeated here.

Corresponding to operation 506 of FIG. 5, FIG. 6C is a perspective view of the LDMOS FinFET 600 including a fin 606, which is formed at one of the various stages of fabrication, according to some embodiments, and FIG. 6D is the corresponding cross-sectional view of the LDMOS FinFET 600, taken along line B-B, of FIG. 6C. In some embodiments, the fin 606 protrudes vertically up form a base portion 604' of the epitaxial layer 604, which can be better seen in the cross-sectional view of FIG. 6D. In some embodiments, the fin 606 is formed by at least some of the following processes: forming at least one patterned layer (not shown) overlaying a region of the epitaxial layer 604 where the fin 606 is intended to be formed; and using the at least one patterned layer as a mask to selectively recess (e.g., etch) the epitaxial layer 604 that is not overlaid by the patterned layer.

Corresponding to operation 508 of FIG. 5, FIG. 6E is a perspective view of the LDMOS FinFET 600 including an isolation region 608 at one of the various stages of fabrication, according to some embodiments, and FIG. 6F is the corresponding cross-sectional view of the LDMOS FinFET 600, taken along line B-B, of FIG. 6E. In some embodiments, the isolation region 608 surrounds a lower portion of the fin 606 and overlays the base portion 604' of the epitaxial layer 604 such that an upper portion of the fin 606 is exposed. In some embodiments, the isolation region 608 is formed by depositing or otherwise growing a dielectric layer (e.g., $SiO_2$) over the epitaxial layer 604, planarizing a top surface of the dielectric layer (e.g., a CMP process), and dry or wet etching back into the dielectric layer to recess the dielectric layer to expose the upper portion of the fin 606.

Corresponding to operation 510 of FIG. 5, FIG. 6G is a perspective view of the LDMOS FinFET 600 including a first semiconductor region 610, which is formed at one of the various stages of fabrication, according to some embodiments, and FIG. 6H is the corresponding cross-sectional view of the LDMOS FinFET 600, taken along line B-B, of FIG. 6G. In some embodiments, the first semiconductor region 610 is doped with a first doping type of dopants (e.g., n-type). As mentioned above, exemplary n-type dopants include P, As, Sb, etc. In some embodiments, the first semiconductor region 610 is formed in the fin 606 (FIG. 6F) by one or more doping processes (e.g., ion implantation processes, diffusion processes, etc.). More specifically, the first semiconductor region 610 is formed to extend downwardly to an upper boundary 602A of the substrate 602. As such, the first semiconductor region 610's lower boundary 610A is aligned with the upper boundary 602A, and a lower portion of the first semiconductor region 610 is surrounded by the isolation region 608 and the underlying base portion 604' of the epitaxial layer 604.

Corresponding to operation 512 of FIG. 5, FIG. 6I is a perspective view of the LDMOS FinFET 600 including a second semiconductor region 612, which is formed at one of the various stages of fabrication, according to some embodiments, and FIG. 6J is the corresponding cross-sectional view of the LDMOS FinFET 600, taken along line B-B, of FIG. 6I. In some embodiments, similarly to the first second semiconductor region 610, the second semiconductor region 612 is doped with the first doping type (n-type) of dopants but with an elevated doping concentration. In some embodiments, the second semiconductor region 612 is formed in the first semiconductor region 610 by one or more doping processes (e.g., ion implantation processes, diffusion processes, etc.). More specifically, the second semiconductor region 612 is formed to extend into an upper portion of the first semiconductor region 610.

Corresponding to operation 514 of FIG. 5, FIG. 6K is a perspective view of the LDMOS FinFET 600 including a third semiconductor region 614, which is formed at one of the various stages of fabrication, according to some embodiments, and FIG. 6L is the corresponding cross-sectional view of the LDMOS FinFET 600, taken along line B-B, of FIG. 6K. In some embodiments, the third semiconductor region 614 is doped with a second doping type of dopants, different from the first doping type of dopants, e.g., p-type. As mentioned above, exemplary p-type dopants include B, Al, Ga, etc. In some embodiments, the third semiconductor region 614 is formed in the first semiconductor region 610 by one or more doping processes (e.g., ion implantation processes, diffusion processes, etc.). More specifically, the third semiconductor region 614 612 is formed to extend into another upper portion of the first semiconductor region 610 that is laterally spaced from the second semiconductor region 612 by an upper portion 610' of the first semiconductor region 610. Alternatively stated, the second semiconductor region 612 and the third semiconductor region 614 are laterally spaced from each other by the upper portion 610' of the first semiconductor region 610.

Corresponding to operation 516 of FIG. 5, FIG. 6M is a perspective view of the LDMOS FinFET 600 including an asymmetric isolation feature 620, which is formed at one of the various stages of fabrication, according to some embodiments, FIG. 6N is the corresponding cross-sectional view of the LDMOS FinFET 600, taken along line B-B of FIG. 6M, and FIG. 6O is the corresponding top view of the LDMOS FinFET 600 of FIG. 6M. In some embodiments, the asymmetric isolation feature 620 straddles the upper portion 610' of the first semiconductor region 610, and a portion of the second semiconductor region 612 that is laterally adjacent to the upper portion 610' of the first semiconductor region 610.

In the illustrated embodiments of FIGS. 6M-6O, the asymmetric isolation feature 620 is formed as a trapezoidal shape when viewing from the top (FIG. 6O). However, similar to the asymmetric gate electrode 320 of the LDMOS transistor 300 (FIGS. 3A-3M), the asymmetric isolation feature 620 may be formed as any of variety of polygonal or curvilinear shapes, for example, a triangle, a pentagon, a semi-circle, etc. In the example where the asymmetric isolation feature 620 is formed as a trapezoidal shape, the asymmetric isolation feature 620 has sidewalls 620A, 620B, 620C, and 620D, wherein the sidewall 620A is relatively adjacent to the third semiconductor region 614; the sidewall 620B is relatively adjacent to the second semiconductor region 612; and the sidewalls 620C and 620D are each coupled between the sidewalls 620A and 620B. In some embodiments, the sidewall 620B has a greater cross-sectional area than the sidewall 620A does, which causes the sidewalls 620C and 620D to be tilted toward each other at respective ends closer to the sidewall 620A.

In some embodiments, the asymmetric isolation feature 620 may be formed by at least some of the following processes: a dielectric stack (e.g., $SiO_2$) is formed (e.g., deposited or grown) to straddle the fin 610; performing at least one patterning process (e.g., a photolithography process) to form a patterned layer over the dielectric stack; and using the patterned layer as a mask while performing one or more dry/wet etching processes on the dielectric stack so as to define the shape of the asymmetric isolation feature 620.

Corresponding to operation 518 of FIG. 5, FIG. 6P is a perspective view of the LDMOS FinFET 600 including respective drain contact region 622, source contact region 624, and body contact region 626, which are formed at one or more of the various stages of fabrication, according to some embodiments, and FIG. 6Q is the corresponding cross-sectional view of the LDMOS FinFET 600, taken along line B-B of FIG. 6P. As shown, the drain contact region 622 is formed in an upper portion of the second semiconductor region 612; the source contact region 624 is formed in an upper portion of the third semiconductor region 614, and is laterally spaced from the upper portion 610' by a portion 614' of the third semiconductor region 614; and the body contact region 626 is formed in an upper portion of the third semiconductor region 614 and is laterally spaced from the upper portion 610' by the portion 614' of the third semiconductor region 614 and the source contact region 624. In some embodiments, the body contact region 626 may laterally contact the source contact region 624.

In some embodiments, the drain contact region 622, source contact region 624, and body contact region 626 are each formed by performing one or more doping processes as described above. In some embodiments, similar to the second semiconductor region 612, the drain contact region 622 is doped with the first doping type (n-type) of dopants but in a further elevated doping concentration; the source contact region 624 is also doped with the n-type of dopants in the further elevated doping concentration; and, similar to the third semiconductor region 614, the body contact region 626 is doped with the second doping type (p-type) of dopants but in an elevated doping concentration. As mentioned above, the polarity of dopants of each of the first semiconductor region 610, the second semiconductor region 612, the third semiconductor region 614, the drain contact region 622, the source contact region 624, and the body contact region 626 can be reversed (i.e., p-type to n-type, and vice versa) for a desired application while remaining within the scope of the present disclosure.

Corresponding to operation 520 of FIG. 5, FIG. 6R is a perspective view of the LDMOS FinFET 600 including a gate stack 630, which is formed at one of the various stages of fabrication, according to some embodiments, FIG. 6S is the corresponding cross-sectional view of the LDMOS FinFET 600, taken along line B-B of FIG. 6R, and FIG. 6T is the top view of the LDMOS FinFET 600 of FIG. 6R. As shown, the gate stack 630 overlays (e.g., straddles) the portion 614' of the third semiconductor region 614 and a portion 620' (e.g., a narrower portion) of the asymmetric isolation feature 620. In some embodiments, the gate stack 630 may laterally extend toward the source contact region 624 to further overlay a portion of the source contact region 624 and underlying third semiconductor region 614.

More specifically, in some embodiments, the gate stack 630 includes a gate dielectric layer 632 and a gate electrode 634, which are further shown in the cross-sectional view of FIG. 6S. The gate dielectric layer 632 is formed to straddle the portion 614' of the third semiconductor region 614. The gate electrode 634 is then formed over the gate dielectric layer 632 to further straddle the portion 614' of the third semiconductor region 614, and over the portion 620' of the asymmetric isolation feature 620 so as to straddle the portion 620' of the asymmetric isolation feature 620 and undelaying first semiconductor region, e.g., 610'. As such, the gate electrode 634 included a concave asymmetric feature. Alternatively stated, the asymmetric feature protrudes inwardly into the gate electrode 634. In the illustrated embodiment of FIG. 6T, the concave asymmetric feature of the gate electrode 634 extends along the sidewall 620A, and along respective portions of the sidewalls 620C and 620D that are relatively closer to the source contact region 624.

The gate electrode 632 and the gate dielectric layer 634 may be formed of substantially similar materials as the asymmetric gate electrode 320 and the gate dielectric layer 316 of the LDMOS transistor 300, respectively. Thus, discussions of the materials and corresponding formation techniques of the gate electrode 632 and the gate dielectric layer 634 are not repeated here.

By forming the gate stack 630 in such a configuration, a plurality of inversed carriers 635 (e.g., electrons) can be induced in the third semiconductor region 614, which can serve as the LDMOS FinFET 600's channel region when the LDMOS FinFET 600 is turned on, and further, an additional plurality of carriers 637 (e.g., electrons) can be induced in the first semiconductor region 610 and the second semiconductor region 612 that typically serve as the LDMOS FinFET 600's drift region. The additionally induced carriers 637 may share the same principle as discussed above with respect to the LDMOS transistor 100 and 300. Thus, discussion of the principle regarding how the carriers 637 are additionally induced is not repeated here.

Figure 7A:
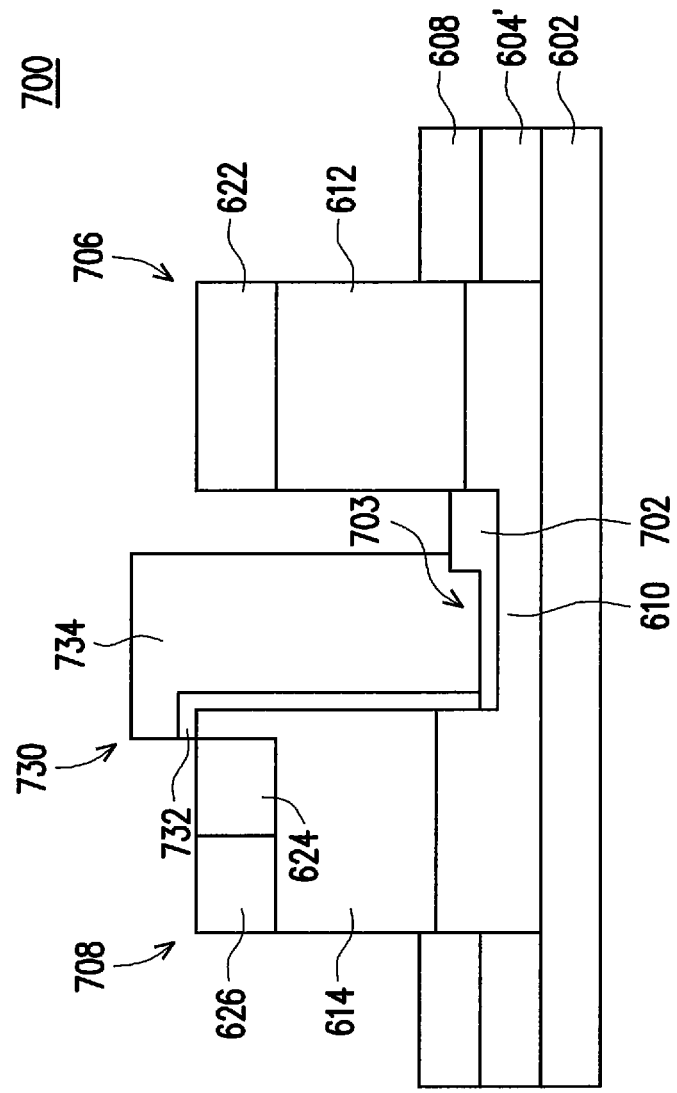
FIG. 7A illustrates a cross-sectional view of an alternative embodiment of the LDMOS FinFET shown in FIGS. 6A-6T, in accordance with some embodiments.

FIG. 7A illustrates a cross-sectional view of another LDMOS FinFET 700, in accordance with some various embodiments of the present disclosure. Some of the reference numerals of the LDMOS FinFET 600, used through FIGS. 6A-6T, (e.g., 602, 604', 608, 610, 612, 622, 614, 624, and 626) are used in the LDMOS FinFET 700, since the LDMOS FinFET 700 is substantially similar to the LDMOS FinFET 600 except that LDMOS FinFET 700's gate stack 730 is formed by disposing respective gate dielectric layer 732 and gate electrode 734 over a recessed isolation region 702. Further, the LDMOS FinFET 700 includes two laterally spaced fins 706 and 708, wherein the fin 706 accommodates the second semiconductor region 612 and drain contact region 622, and the fin 708 accommodates the third semiconductor region 614, the source contact region 624, and the body contact region 626, respectively. In some embodiments, the isolation region 702 includes a recessed trench 703 that has an asymmetric geometric shape (hereinafter "asymmetric trench 703"), which is shown in an exemplary embodiment of FIG. 7B.

Figure 7B:
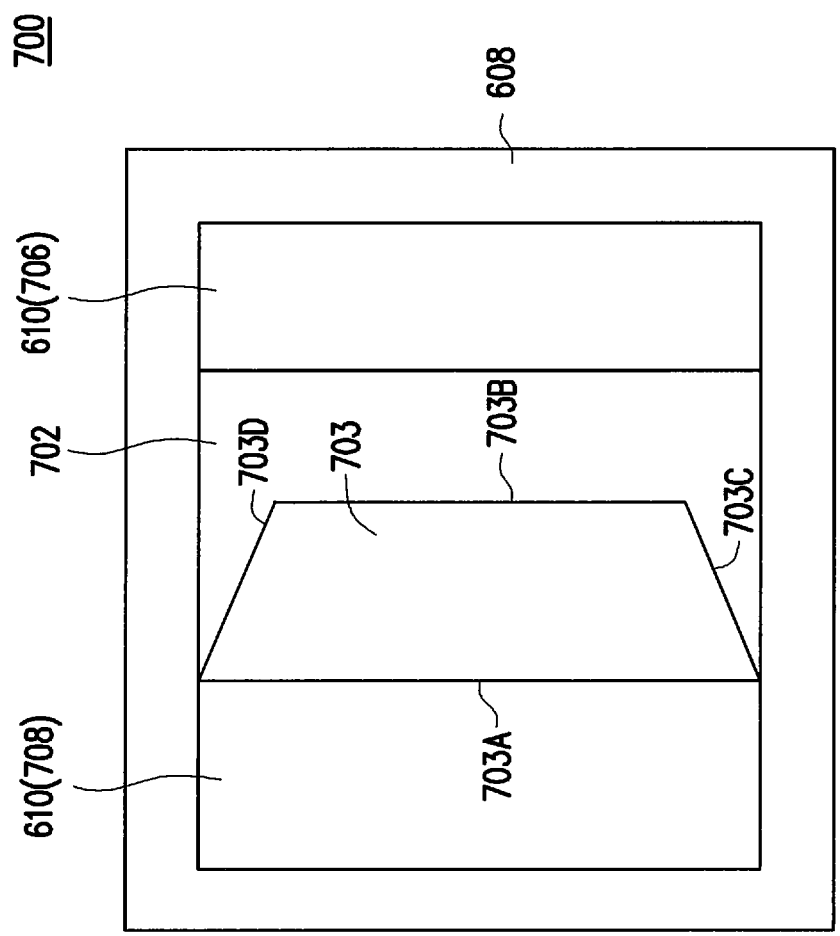
FIG. 7B illustrates a top view of the alternative embodiment of the LDMOS FinFET shown in FIG. 7A at one fabrication stage, in accordance with some embodiments.

FIG. 7B illustrates a top view of the LDMOS FinFET 700 when the asymmetric trench 703 is formed at one of various stages of fabrication, according to some embodiments. The asymmetric trench 703 is recessed in the isolation region 702, and includes sidewalls 703A, 703B, 703C, and 703D, wherein respective cross-sectional areas of the sidewalls 703A and 703B are different causing the sidewalls 703C and 703D to be tilted toward each other. In some embodiments, such an asymmetric trench 703 is substantially similar to the trench 132 as shown in FIGS. 1A-1B. Thus, formation of the asymmetric trench 703 is not repeated here.

It is noted that at this fabrication stage, the second semiconductor region 612 and drain contact region 622 are not yet formed in the fin 706, and the third semiconductor region 614, the source contact region 624, and the body contact region 626 are not yet formed in the fin 708. As such, the fins 706 and 708, laterally spaced from each other by the isolation region 702, may still include the first semiconductor region 610.

Referring again to FIG. 7A, in some embodiments, the gate electrode 734 is formed by refilling the asymmetric trench 703 with at least one conductive material (e.g., polysilicon and/or metal material) such that the gate electrode 734, at least a lower portion, may have such an asymmetric geometric shape. Similar to the LDMOS transistors 100, 300, and the LDMOS FinFET 600, additional carriers (e.g., electrons) can be induced in the LDMOS FinFET 700's respective drift region (e.g., the first semiconductor region 610), which advantageously reduces a respective ON resistance as discussed above.

In an embodiment, a semiconductor device is disclosed. The semiconductor device includes: a first semiconductor region disposed over a second semiconductor region, wherein the first and second semiconductor regions have a first doping type and a second doping type, respectively; a first source/drain contact region and a second source/drain contact region having the second doping type and laterally spaced; and a gate electrode disposed laterally between the first and second source/drain contact regions, wherein the gate electrode comprises a first sidewall relatively closer to the first source/drain region and a second sidewall relatively closer to the second source/drain region, and wherein respective cross-sectional areas of the first and second sidewalls of the gate electrode are different from each other.

Yet in another embodiment, a semiconductor device includes: a first semiconductor region disposed over a second semiconductor region, wherein the first and second semiconductor regions have a first doping type and a second doping type, respectively; a first source/drain contact region and a second source/drain contact region having the second doping type and laterally spaced; and a gate electrode disposed laterally between the first and second source/drain contact regions, wherein the gate electrode comprises a first sidewall, a second sidewall, a third sidewall, and a fourth sidewall, wherein the first sidewall is adjacent to the first source/drain region and the second sidewall is adjacent to the second source/drain region, and the third and fourth sidewalls are respectively coupled between the first and second sidewalls, and wherein a cross-sectional area of the first sidewall is greater than a cross-sectional area of the second sidewall.

Yet in another embodiment, a method includes: forming an isolation region extending into a substrate; forming a first semiconductor region with a first doping type in the substrate; forming a second semiconductor region with a second doping type in an upper portion of the first semiconductor region, the second doping type being different from the first doping type; forming an asymmetric trench in the isolation region thereby exposing a sidewall of the second semiconductor region; and forming an asymmetric gate electrode by refilling the asymmetric trench with a conductive material, wherein the asymmetric gate electrode comprises a first sidewall relatively closer to the second semiconductor region and a second sidewall relatively farther from the second semiconductor region, and wherein respective cross-sectional areas of the first and second sidewalls are different from each other.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an isolation region extending into a substrate;
    forming a first semiconductor region with a first doping type in the substrate;
    forming a second semiconductor region with a second doping type in an upper portion of the first semiconductor region, the second doping type being different from the first doping type;
    forming an asymmetric trench in the isolation region thereby exposing a sidewall of the second semiconductor region;
    forming an asymmetric gate electrode by refilling the asymmetric trench with a conductive material, wherein the asymmetric gate electrode comprises a first sidewall relatively closer to the second semiconductor region and a second sidewall relatively farther from the second semiconductor region, and wherein respective cross-sectional areas of the first and second sidewalls are different from each other, wherein the second sidewall has a shorter width than a width of the first sidewall so as to provide a trapezoidal shape of the asymmetric gate electrode.

2. The method of claim 1, further comprising:
    forming drain contact, source contact, and body regions in an upper portion of the first semiconductor region, a first upper portion of the second semiconductor region, and a second upper portion of the second semiconductor region, respectively,
    wherein the drain contact region is laterally spaced from the source and body contact regions by the isolation region.

3. The method of claim 1, wherein the cross-sectional area of the first sidewall of the gate electrode is substantially greater than the cross-sectional area of the second sidewall of the gate electrode.

4. The method of claim 1, wherein:
    a first drift region and a second drift region is formed in the second semiconductor region when the semiconductor device is turned on, wherein the first drift region extends along at least part of a third sidewall of the gate electrode and the second drift region extends along at least part of a fourth sidewall of the gate electrode, the third and fourth sidewalls of the gate electrode being coupled between the first and second sidewalls of the gate electrode, respectively.

5. The method of claim 1, further comprising recessing a bottom surface of the gate electrode below a lower boundary of the first semiconductor region.

6. The method of claim 1, further comprising:
forming a gate dielectric layer surrounding at least a lower portion of the gate electrode.

7. The method of claim 1, further comprising:
forming a first source/drain contact region adjacent a first side of the asymmetric gate electrode; and
forming a second source/drain contact region adjacent a second side of the asymmetric gate electrode opposite the first side,
wherein the isolation region is disposed laterally between the first and second source/drain contact regions, and wherein the gate electrode extends into the isolation region.

8. The method of claim 7, wherein the second sidewall of the gate electrode is laterally spaced from the second source/drain contact region by part of the isolation region.

9. A method manufacturing a semiconductor device, comprising:
providing a substrate;
forming a first semiconductor region in the substrate;
forming a second semiconductor region over the first semiconductor region, wherein the first and second semiconductor regions have a first doping type and a second doping type, respectively;
forming a first source/drain contact region and a second source/drain contact region having the second doping type and laterally spaced from each other; and
forming a gate electrode disposed laterally between the first and second source/drain contact regions, wherein the gate electrode comprises a first sidewall relatively closer to the first source/drain region and a second sidewall relatively closer to the second source/drain region, and wherein respective cross-sectional areas of the first and second sidewalls of the gate electrode are different from each other, wherein the second sidewall has a shorter width than a width of the first sidewall so as to provide a trapezoidal shape of the asymmetric gate electrode, and
wherein a channel region is formed in the first semiconductor region when the semiconductor device is turned on, wherein the channel region extends vertically from the first source/drain contact region, along the first sidewall of the gate electrode, and to a lower boundary of the first semiconductor region.

10. The method of claim 9, wherein the first doping type is different from the second doping type.

11. The method of claim 9, wherein the cross-sectional area of the first sidewall of the gate electrode is substantially greater than the cross-sectional area of the second sidewall of the gate electrode.

12. The method of claim 9, wherein:
a first drift region and a second drift region are formed in the second semiconductor region when the semiconductor device is turned on, wherein the first drift region extends along at least part of a third sidewall of the gate electrode and the second drift region extends along at least part of a fourth sidewall of the gate electrode, the third and fourth sidewalls of the gate electrode being coupled between the first and second sidewalls of the gate electrode, respectively.

13. The method of claim 9, further comprising recessing a bottom surface of the gate electrode below a lower boundary of the first semiconductor region.

14. The method of claim 9, further comprising:
forming a gate dielectric layer surrounding at least a lower portion of the gate electrode.

15. The method of claim 9, further comprising:
forming an isolation region disposed laterally between the first and second source/drain contact regions, wherein the gate electrode extends into the isolation region.

16. The method of claim 15, wherein the second sidewall of the gate electrode is laterally spaced from the second source/drain contact region by part of the isolation region.

17. A method manufacturing a semiconductor device, comprising:
providing a substrate;
forming a first semiconductor region in the substrate;
forming a second semiconductor region over the first semiconductor region, wherein the first and second semiconductor regions have a first doping type and a second doping type, respectively;
forming a first source/drain contact region and a second source/drain contact region having the second doping type and laterally spaced from one another;
forming an asymmetric gate electrode disposed laterally between the first and second source/drain contact regions, wherein the gate electrode comprises a first sidewall, a second sidewall, a third sidewall, and a fourth sidewall, wherein the first sidewall is adjacent to the first source/drain region and the second sidewall is adjacent to the second source/drain region, and the third and fourth sidewalls are respectively coupled between the first and second sidewalls, and wherein the second sidewall has a shorter width than a width of the first sidewall so as to provide a trapezoidal shape of the asymmetric gate electrode,
wherein a channel region is formed in the first semiconductor region when the semiconductor device is turned on, wherein the channel region extends vertically from the first source/drain contact region, along the first sidewall of the gate electrode, and to a lower boundary of the first semiconductor region.

18. The method of claim 17, wherein the first doping type is different from the second doping type.

19. The method of claim 17, further comprising:
forming a gate dielectric layer surrounding at least a lower portion of the gate electrode.

20. The method of claim 19, further comprising:
forming an isolation region disposed laterally between the first and second source/drain contact regions, wherein the gate electrode extends into the isolation region.

* * * * *